(12) United States Patent
Demura

(10) Patent No.: US 12,205,805 B2
(45) Date of Patent: Jan. 21, 2025

(54) SPUTTERING APPARATUS, FILM FORMATION METHOD, AND METHOD FOR MANUFACTURING PRODUCT

(71) Applicant: CANON KABUSHIKI KAISHA, Tokyo (JP)

(72) Inventor: Kazuya Demura, Tokyo (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 17/867,100

(22) Filed: Jul. 18, 2022

(65) Prior Publication Data
US 2023/0029343 A1    Jan. 26, 2023

(30) Foreign Application Priority Data

Jul. 20, 2021 (JP) .................................. 2021-119750
Jun. 27, 2022 (JP) .................................. 2022-102320

(51) Int. Cl.
| | | |
|---|---|---|
| H01J 37/34 | (2006.01) | |
| C23C 14/34 | (2006.01) | |
| C23C 14/35 | (2006.01) | |
| C23C 14/54 | (2006.01) | |
| H01J 37/32 | (2006.01) | |

(52) U.S. Cl.
CPC ...... *H01J 37/3435* (2013.01); *C23C 14/3407* (2013.01); *C23C 14/35* (2013.01); *C23C 14/54* (2013.01); *H01J 37/32449* (2013.01); *H01J 37/3423* (2013.01); *H01J 37/3438* (2013.01); *H01J 37/3441* (2013.01); *H01J 37/345* (2013.01); *H01J 37/3476* (2013.01); *H01J 37/3405* (2013.01)

(58) Field of Classification Search
CPC .............. H01J 37/3441; H01J 37/3438; H01J 37/3476; H01J 37/3405; H01J 37/342; H01J 37/3423; H01J 37/3435; C23C 14/35; C23C 14/54; C23C 14/3407; C23C 14/52
See application file for complete search history.

(56) References Cited

U.S. PATENT DOCUMENTS

| | | | | |
|---|---|---|---|---|
| 4,885,070 A | * | 12/1989 | Campbell ............... | C23C 14/46 204/298.18 |
| 4,933,057 A | * | 6/1990 | Sebastiano ............ | C03C 17/002 204/192.12 |
| 5,106,474 A | * | 4/1992 | Dickey ............... | H01J 37/3438 204/298.22 |

(Continued)

FOREIGN PATENT DOCUMENTS

| | | | | |
|---|---|---|---|---|
| JP | 2008-202079 A | | 9/2008 | |
| JP | 2016151040 A | * | 8/2016 | ............. C23C 14/52 |
| KR | 20190080127 A | * | 7/2019 | |

OTHER PUBLICATIONS

Derwent Abstract JP 2016151040 (Year: 2016).*

*Primary Examiner* — Michael A Band
(74) *Attorney, Agent, or Firm* — VENABLE LLP

(57) ABSTRACT

A sputtering apparatus includes a placement portion where a target having a first opening is placed, an anode, and a metal member. The anode and the metal member are disposed at positions corresponding to the first opening of the target in the placement portion. The anode and the metal member are electrically insulated from each other. The metal member is set to a ground potential or a floating potential.

16 Claims, 15 Drawing Sheets

(56) References Cited

U.S. PATENT DOCUMENTS

| | | | | |
|---|---|---|---|---|
| 5,292,419 A | * | 3/1994 | Moses | C23C 14/3407 |
| | | | | 204/298.26 |
| 5,378,341 A | * | 1/1995 | Drehman | H01J 37/3438 |
| | | | | 204/298.18 |
| 8,500,973 B2 | * | 8/2013 | Ockenfuss | H01J 37/3438 |
| | | | | 204/298.14 |

* cited by examiner

SPUTTERING APPARATUS, FILM FORMATION METHOD, AND METHOD FOR MANUFACTURING PRODUCT

BACKGROUND OF THE INVENTION

Field of the Invention

The present disclosure relates to a sputtering technique.

Description of the Related Art

Sputtering is used as a film formation method for a compound film such as a metal oxide film. Japanese Patent Laid-Open No. 2008-202079 discloses a sputtering apparatus including a target serving as a cathode, and an anode disposed at the center of the target. The anode is provided to face an electric discharge space serving as a plasma generation space.

In the configuration disclosed in Japanese Patent Laid-Open No. 2008-202079, since the anode faces the plasma generation space, a compound film is formed on the anode. When the formation of the compound film on the anode progresses, there is a possibility that the current flowing to the anode decreases and the plasma cannot be stably generated.

SUMMARY OF THE INVENTION

According to one aspect of the present invention, a sputtering apparatus includes a placement portion where a target having a first opening is placed, an anode, and a metal member. The anode and the metal member are disposed at positions corresponding to the first opening of the target in the placement portion. The anode and the metal member are electrically insulated from each other. The metal member is set to a ground potential or a floating potential.

Further features of the present invention will become apparent from the following description of exemplary embodiments with reference to the attached drawings.

DESCRIPTION OF THE EMBODIMENTS

Embodiments of the present invention will be described in detail below with reference to drawings.

First Embodiment

Figure 1:
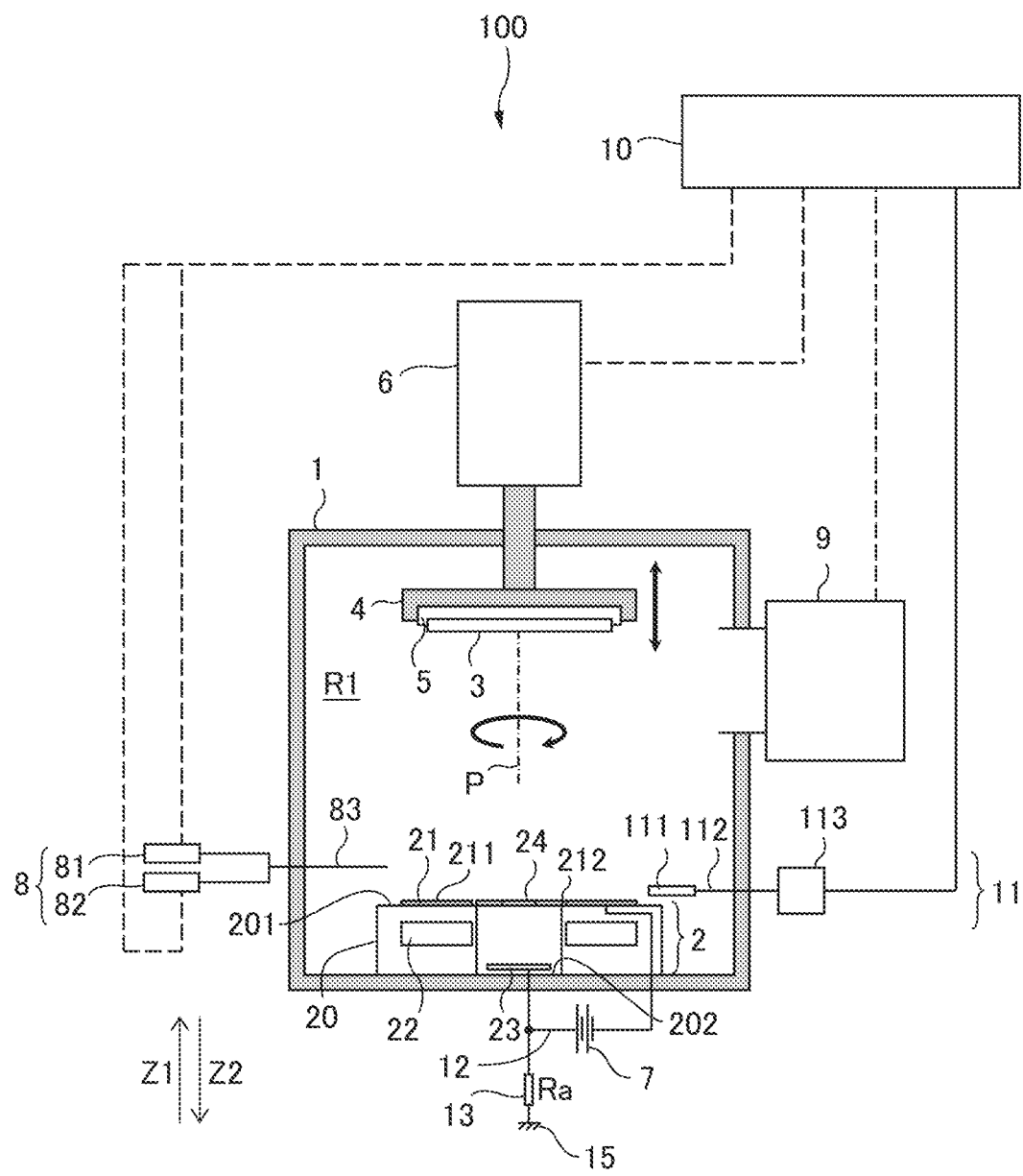
FIG. 1 is an explanatory diagram of a sputtering apparatus according to a first embodiment.

FIG. 1 is an explanatory diagram of a sputtering apparatus 100 according to a first embodiment. In the first embodiment, the sputtering apparatus 100 is a magnetron sputtering apparatus. The sputtering apparatus 100 forms, by reactive sputtering, a compound film such as an insulating thin film on the surface of a substrate 3 serving as a film formation target. A product such as a final product or an intermediate product is manufactured by forming a thin film on the surface of the substrate 3 by the sputtering apparatus 100. The substrate 3 is, for example, a lens substrate, and the film that is formed is, for example, an antireflection film. The sputtering apparatus 100 manufactures a lens as the product.

The sputtering apparatus 100 includes a chamber 1 serving as an example of a vacuum container, a unit 2 serving as a cathode portion where a target 21 that functions as a cathode is placed, a holder 5 that holds the substrate 3, a support mechanism 4 that supports the holder 5, and a rotating/lifting/lowering mechanism 6. A space serving as a film formation chamber R1 is defined in the chamber 1.

The unit 2, the holder 5, and the support mechanism 4 are disposed inside the chamber 1, that is, in the film formation chamber R1. The target 21 is a member having a flat plate shape and containing a film formation material.

The unit 2 includes a unit body 20 serving as an example of a placement portion. The target 21 is fixed to the unit body 20. The unit body 20 includes a plurality of metal parts that are formed from metal such as stainless steel.

Further, the sputtering apparatus 100 includes a power source 7 that supplies power to the unit 2, a gas supply line 8 that supplies a gas required for film formation, and an exhaustion apparatus 9 connected to the chamber 1. Further, the sputtering apparatus 100 includes a control apparatus 10 that controls the operation of each part of the sputtering apparatus 100, and a plasma emission monitor 11.

The power source 7 is preferably a direct current power source, and among direct current power sources, may be a power source apparatus that continuously supplies a current, or a direct current pulse power source that is a power source apparatus that supplies a pulse current.

The support mechanism 4 is a mechanism that is placed on a top plate of the chamber 1 and supports the holder 5 such that the substrate 3 is parallel to the top plate. By employing a configuration in which the substrate 3 is supported by the support mechanism 4 via the holder 5 as described above, the following operation can be performed. That is, the holder 5 is caused to hold the substrate 3 outside the chamber 1 in advance, and the holder 5 and the substrate 3 are collectively placed in an unillustrated load-lock. The holder 5 and the substrate 3 are collectively conveyed into the chamber 1 from the load-lock through an unillustrated conveyance port by an unillustrated conveyance mechanism such as a robot arm, and the holder 5 is attached to the support mechanism 4. Since such an operation as described above can be performed, an operation of attaching the substrate 3 to the support mechanism 4 can be easily performed. To be noted, although the support mechanism 4 is configured to support the substrate 3 via the holder 5, the configuration is not limited to this, and the support mechanism 4 may directly support the substrate 3.

The support mechanism 4 is connected to the rotating/lifting/lowering mechanism 6, and is capable of rotating about a rotation axis P and ascending/descending in a direction perpendicular to a substrate support surface of the holder 5. To be noted, to help the operation of supporting the holder 5, an operation of swinging the support mechanism 4 may be added to the rotating/lifting/lowering mechanism 6.

Figure 2:
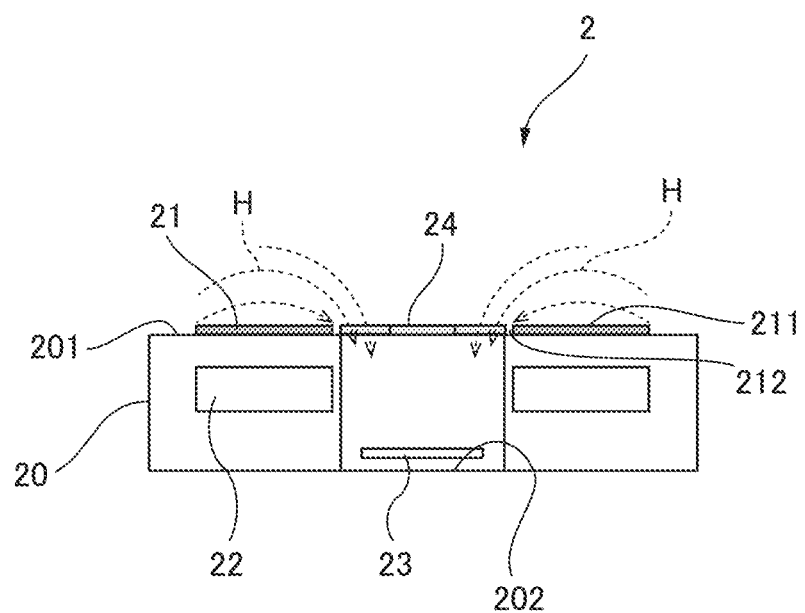
FIG. 2 is an explanatory diagram of a unit and a target according to the first embodiment.
Figure 2:
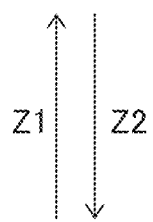

FIG. 2 is an explanatory diagram of the unit 2 and the target 21 illustrated in FIG. 1. The unit body 20 includes a main surface 201 to which the target 21 is attached. A surface 211 of the target 21 that is sputtered is parallel to the main surface 201. A direction perpendicular to the surface 211 and directed from the surface 211 to the support mechanism 4, that is, a direction perpendicular to the main surface 201 and directed from the main surface 201 to the support mechanism 4 will be referred to as a Z1 direction. The Z1 direction is a normal direction of the surface 211, and is also a normal direction of the main surface 201. A direction opposite to the Z1 direction will be referred to as a Z2 direction. The unit body 20 includes a recess portion 202 recessed in the Z2 direction with respect to the main surface 201. The target 21 has an opening 212 defined at a position corresponding to the recess portion 202 as viewed in the Z1 direction and the Z2 direction. The opening 212 serves as an example of a first opening. That is, the target 21 is disposed on the main surface 201 such that the opening 212 corresponds to the recess portion 202 as viewed in the Z1 and Z2. The opening 212 is defined at a center portion of the target 21.

The unit 2 includes an anode 23 and a metal member 24. The anode 23 and the metal member 24 are disposed at positions (space) corresponding to the opening 212 of the target 21 as viewed in the Z1/Z2 direction. The anode 23 and the metal member 24 are disposed at the unit body 20 in an electrically insulated state from each other. As a result of the anode 23 and the metal member 24 being electrically insulated from each other in the unit body 20, a short circuit between the anode 23 and the metal member 24 can be suppressed, and the anode 23 and the metal member 24 can be maintained at different potentials from each other. To be noted, in the first embodiment, the target 21 serving as a cathode, the anode 23, and the metal member 24 are not in contact with each other, and therefore the target 21, the anode 23, and the metal member 24 can be maintained at different potentials from each other. Although these members are configured to be not in contact with each other such that the members can be maintained at different potentials, the members may be in contact with each other as long as the members are electrically insulated from each other.

The anode 23 and the metal member 24 are each formed from metal such as stainless steel. Since the anode 23 is disposed at a position corresponding to the opening 212 of the target 21 serving as a cathode, scattering of the generated plasma from the vicinity of the target 21 is reduced, and thus a plasma that is uniformly distributed in the vicinity of the target 21 can be generated.

A power source 7 is connected to the target 21 and the anode 23. Specifically, the anode 23 is electrically connected to a positive electrode (+ electrode) of the power source 7, and the target 21 is electrically connected to a negative electrode (− electrode) of the power source 7. As a result of this, power to generate the plasma is supplied to the target 21 and the anode 23.

In addition, the unit 2 includes a magnet 22 disposed under the target 21 in the unit body 20. The magnet 22 is constituted by a plurality of magnet members arranged to have different polarity directions such that a magnetic field H along the surface 211 of the target 21 is formed in a direction from above the target 21 toward the opening 212, that is, toward the recess portion 202. As a result of the magnetic field H formed by the magnet 22, electrons in the plasma are retained in the vicinity of the surface 211 of the target 21 without scattering therefrom, and thus sputtering can be performed efficiently at a low voltage. Further, since the magnetic field H along the surface 211 of the target 21 is oriented to converge at the anode 23, the electrons can efficiently flow into the anode 23.

In addition, the unit 2 has an unillustrated cooling structure for cooling the target 21 from the back surface side to suppress rise of the temperature of the surface 211 of the target 21 beyond a predetermined temperature caused by the plasma generated on the surface 211 of the target 21.

An unillustrated sticking prevention plate is disposed in the chamber 1 so as to cover the inner wall thereof. The unillustrated sticking prevention plate, the substrate 3, the holder 5, the support mechanism 4, and the plasma emission monitor 11 are each set to a floating potential. The gas supply line 8 is set to a ground potential in the first embodiment. However, the gas supply line 8 is not limited to the ground potential, and may be set to a floating potential.

To make the potential of the anode 23 higher than the ground potential, a resistor 13 connected to the ground 15 is connected to a wire 12 interconnecting the anode 23 and the power source 7. As described above, since the anode 23 connected to the positive electrode of the power source 7 is electrically connected to the ground 15 via the resistor 13, the potential of the anode 23 is a positive potential higher than the ground potential.

The electric resistance Ra of the resistor 13 is, although it depends on the magnetic field formed by the magnet 22, that is, the magnetic flux density, the sputtering conditions, and the like, preferably in the range of 40 k$\Omega$≤Ra≤220 k$\Omega$. That is, the electric resistance Ra is preferably 40 k$\Omega$ or more and 220 k$\Omega$ or less. In addition, the resistance Ra is more preferably 45 k$\Omega$ or more and 105 k$\Omega$ or less.

In the case of performing reactive sputtering, the target 21 is a metal target. A process gas and a reactive gas for sputtering are supplied from the gas supply line 8. The supply flow rates of the process gas and the reactive gas are respectively adjusted by mass flow controllers 81 and 82, and the gases are supplied into the chamber 1 from a gas supply pipe 83 after being mixed together. To be noted, the gas supply pipe 83 is not limited to a structure that mixes the process gas and the reactive gas, and may have a structure that separately supplies the process gas and the reactive gas.

The process gas may be any gas as long as the gas collides with electrons in the plasma to ionize into positive ions and can sputter the metal target, and is preferably, for example, an argon (Ar) gas. The reactive gas is supplied when performing reactive sputtering in a reactive (oxide) mode or a transition mode. For example, when performing reactive sputtering while oxidizing the surface 211 of the metal target 21, an oxygen ($O_2$) gas is used as the reactive gas.

The plasma emission monitor 11 includes a detection portion 111, an optical fiber 112, and a spectrometer 113. The detection portion 111 detects light emission of the plasma, and is provided in the vicinity of the surface 211 of the target 21. The optical fiber 112 transmits plasma light detected by the detection portion 111. The spectrometer 113 divides the plasma light obtained from the optical fiber 112 into line spectra. Information of emission intensity of light of a predetermined wavelength detected by the spectrometer 113 is transmitted to the control apparatus 10. That is, the control apparatus 10 obtains, by the spectrometer 113, the emission intensity of light of a wavelength related to the target 21, emission intensity of light related to the process gas, and the like.

In the control apparatus 10, the value of the obtained emission intensity or the value of an emission intensity ratio of two wavelengths selected from obtained wavelengths is set as a control value, and a control signal can be generated every obtaining interval to stabilize the control value. This control signal is transmitted to the mass flow controller 82 of the reactive gas provided in the gas supply line 8, and thus the flow rate of the reactive gas is adjusted by the mass flow controller 82.

Further, the control apparatus 10 can obtain information of the voltage during plasma generation from the power source 7, and can generate the control signal every obtaining interval to stabilize the control value by using the voltage as the control value. This control signal is transmitted to the mass flow controller 82 of the reactive gas, and thus the flow rate of the reactive gas is adjusted by the mass flow controller 82.

The control algorithm of the control apparatus 10 described above is executed as proportional-integral-derivative (PID) control. In addition, the flow rate of the process gas during plasma generation, the rotation speed and the position in the lifting/lowering direction of the holder 5 by the rotating/lifting/lowering mechanism 6, the exhaustion speed of the exhaustion apparatus 9, and the like can be set via the control apparatus 10.

Next, a film formation method for forming a compound film on the surface of the substrate 3, that is, a manufacturing method for a product will be described. When forming a compound film on the substrate 3, first, the target 21 is placed on the unit body 20 of the unit 2, and the support mechanism 4 supports the substrate 3. Oxygen ($O_2$) and argon (Ar) are supplied to the decompressed film formation chamber R1 as a reactive gas and a process gas, respectively. Then, a film containing metal oxide is formed on the surface of the substrate 3 as a compound film by reactive sputtering.

Figure 3A:
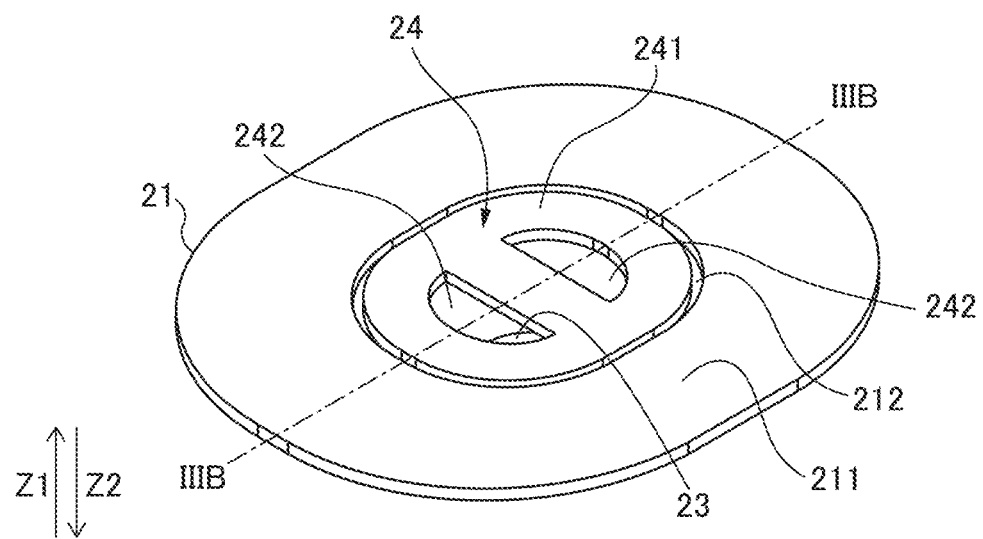
FIG. 3A is a perspective view of the target, an anode, and a metal member according to the first embodiment.
Figure 3B:
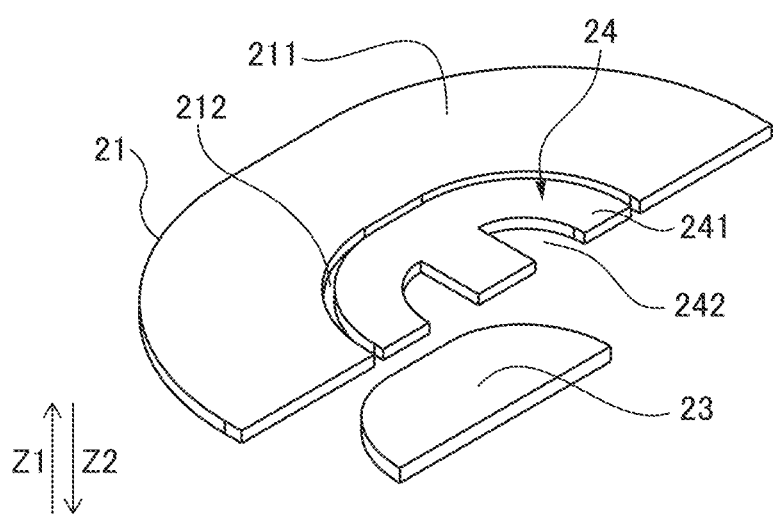
FIG. 3B is a perspective view of the target, the anode, and the metal member according to the first embodiment cut along a line IIIB-IIIB of FIG. 3A.

FIG. 3A is a perspective view of the target 21, the anode 23, and the metal member 24 according to the first embodiment. FIG. 3B is a perspective view of the target 21, the anode 23, and the metal member 24 cut along a line IIIB-IIIB of FIG. 3A. The opening 212 is defined in a center portion of the target 21. The target 21 is formed in an oval shape as viewed in the Z1/Z2 direction. Here, in the case where the target has a shape having an angular portion, when an insulating metal oxide film is accumulated at the angular portion of the target, arcing caused by ionization and electrification of the metal oxide film is likely to occur. In contrast, in the first embodiment, the target 21 has a shape in which no angular portion is provided on the inner circumference and the outer circumference. As a result of forming the target 21 in such a shape, arcing caused by formation of the insulating metal oxide film can be reduced. To be noted, although the target 21 is formed in an oval shape, the shape is not limited to this, and may be, for example, a ring shape.

The anode 23 is a plate-shaped metal, and is disposed in the recess portion 202 of the unit body 20. The metal member 24 is electrically insulated from the anode 23 and the target 21 so as to have a different potential from the anode 23 and the target 21. Specifically, the metal member 24 is set to a ground potential or a floating potential. The metal member 24 includes a shielding portion 241 disposed at a position opposing the anode 23 in the Z1/Z2 direction. The anode 23 and the metal member 24, that is, the shielding portion 241 are disposed at an interval in the Z1/Z2 direction, electrically insulated from each other, and maintained at different potentials. That is, the anode 23 is maintained at an anode potential, that is, a positive potential, and the metal member 24 is maintained at the ground potential or the floating potential that is lower than the anode potential. To be noted, in the case where the metal member 24 is at the floating potential, electrons in the plasma are supplied to the metal member 24, and therefore the potential of the metal member 24 becomes a negative potential lower than the ground potential.

Since the shielding portion 241 of the metal member 24 is at a position away from the anode 23 in the Z1 direction, the anode 23 is shielded by the shielding portion 241, and therefore formation of the insulating metal oxide film on the anode 23 can be reduced. As a result of this, elimination of the potential of the anode 23, that is, the anode potential can be suppressed. That is, reduction of a current flowing to the anode 23 can be reduced. As described above, since formation of the metal oxide film on the anode 23 can be reduced, the plasma can be stably generated for a long period.

In the first embodiment, the shielding portion 241 has a plurality of, for example, two openings 242 as at least one second opening. The openings 242 are each smaller than the opening 212. As a result of this, electrons in the plasma generated in the vicinity of the target 21 serving as a cathode are more likely to flow to the anode 23 through the openings 242 of the shielding portion 241.

In FIG. 3A, the openings 242 are each formed in a semicircular shape, but the shape is not limited to this. The openings 242 each may have any shape as long as electrons can pass therethrough, and for example, the shape may be a circular shape or a rectangular shape. In the case of forming each of the openings 242 in a semicircular or circular shape, although it depends on the magnetic field (magnetic flux density) formed by the magnet 22, the sputtering conditions, and the like, the radius of each of the openings 242 is preferably 7.5 mm or more. In addition, in the case of forming each of the openings 242 in a rectangular shape, the length of the short side of each of the openings 242 is preferably 15 mm or more.

In the first embodiment, the shielding portion 241 is disposed at the same height as the target 21 in the Z1/Z2 direction. As a result of this, the anode 23 is effectively shielded by the shielding portion 241, and thus formation of the metal oxide film on the anode 23 can be effectively reduced.

As described above, according to the first embodiment, the anode 23 is shielded by the metal member 24, and therefore formation of a compound film on the anode 23 is reduced. As a result of this, the plasma can be stably generated for a long period.

To be noted, although the power source 7 is a direct current power source in the first embodiment, the power source 7 may be an alternate current power source. In this case, the alternate current power source is connected to the anode 23 and the target 21, and an alternate current power is supplied to the anode 23 and the target 21. In this case, the resistor 13 may be omitted.

Second Embodiment

Figure 4A:
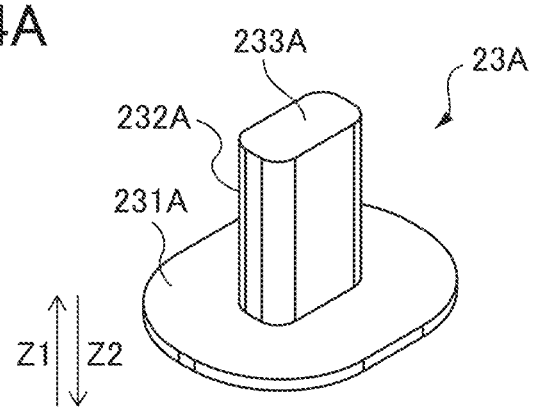
FIG. 4A is a perspective view of an anode according to a second embodiment.

Although the anode 23 of the first embodiment described above is formed in a plate shape as illustrated in FIG. 3B, the structure is not limited to this. FIG. 4A is a perspective view of an anode 23A according to a second embodiment. The anode 23A of a sputtering apparatus of the second embodiment has a different configuration from the anode 23 of the sputtering apparatus 100 of the first embodiment. In the sputtering apparatus of the second embodiment, the other elements than the anode 23A are substantially the same as in the sputtering apparatus 100 of the first embodiment, and therefore description thereof will be omitted.

The anode 23A illustrated in FIG. 4A is disposed in the recess portion 202 of the unit body 20 illustrated in FIGS. 1 and 2. As illustrated in FIG. 4A, the anode 23A of the second embodiment includes a base portion 231A, and a projection portion 232A projecting in the Z1 direction with respect to the base portion 231A. For example, the projection portion 232A is formed in a prism shape. The anode 23A is disposed such that a distal end 233A of the projection portion 232A in the Z1 direction does not project more in the Z1 direction than the surface 211 of the target 21 illustrated in FIGS. 1 and 2. To be noted, the distal end 233A is, for example, a flat surface. In addition, the anode 23A is disposed such that the distal end 233A of the projection portion 232A in the Z1 direction does not project more in the Z1 direction than the main surface 201 of the unit body 20. Further, the anode 23A opposes the shielding portion 241 of the metal member 24 with a gap therebetween in the Z1/Z2 so as to be not in contact with the shielding portion 241 of the metal member 24. In the second embodiment, the distal end 233A of the projection portion 232A of the anode 23A opposes the shielding portion 241 of the metal member 24 with a gap therebetween in the Z1/Z2 so as to be not in contact with the shielding portion 241 of the metal member 24.

In addition, the side surface of the projection portion 232A opposes the side surface of the recess portion 202 with a gap therebetween. The separation distance between the side surface of the projection portion 232A and the side surface of the recess portion 202 is, although it depends on the magnetic field, the sputtering conditions, and the like, preferably 8 mm or more in a direction perpendicular to the side surface of the projection portion 232A. According to this arrangement, electrons are more likely to flow to the space between the side surface of the projection portion 232A and the side surface of the recess portion 202. As a result of this, the anode 23A having the projection portion 232A can efficiently collect the electrons in the plasma even if the anode 23A is surrounded by the side surface of the recess portion 202.

Third Embodiment

Figure 4B:
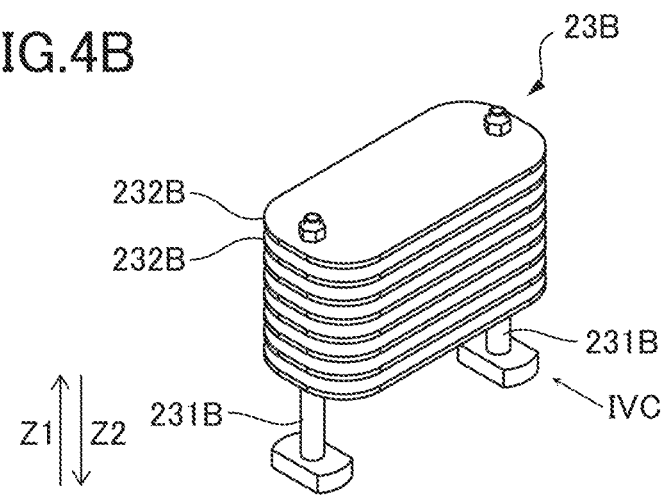
FIG. 4B is a perspective view of an anode according to a third embodiment.
Figure 4C:
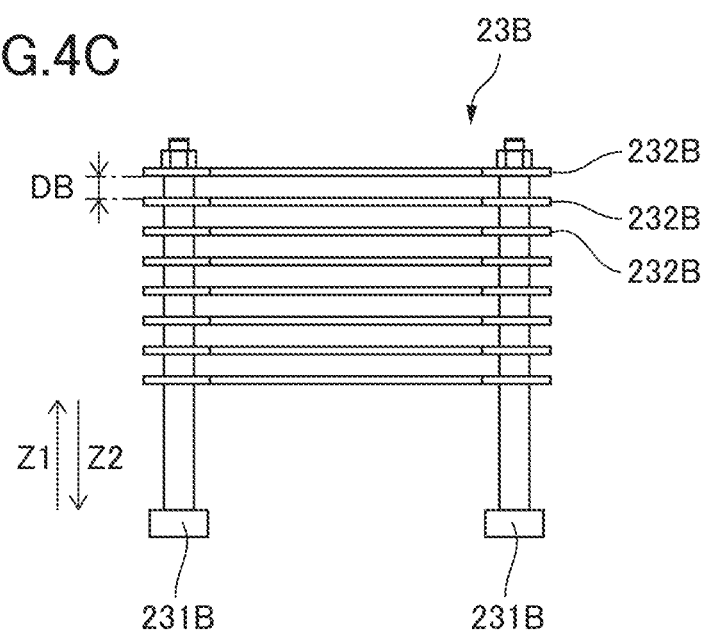
FIG. 4C is a side view of the anode as viewed in an arrow IVC direction of FIG. 4B.

FIG. 4B is a perspective view of an anode 23B according to a third embodiment. FIG. 4C is a side view of the anode 23B as viewed in a direction of an arrow IVC of FIG. 4B. The anode 23B of a sputtering apparatus of the third embodiment has a different configuration from the anode 23 of the sputtering apparatus 100 of the first embodiment. In the sputtering apparatus of the third embodiment, the other elements than the anode 23B are substantially the same as in the sputtering apparatus 100 of the first embodiment, and therefore description thereof will be omitted.

The anode 23B of the third embodiment illustrated in FIGS. 4B and 4C includes a plurality of metal plates 232B arranged at intervals in the Z1/Z2 direction, and a support portion 231B formed from metal and supporting the plurality of metal plates 232B. A distance DB between two adjacent metal plates 232B among the plurality of metal plates 232B in the Z1/Z2 direction is preferably 2 mm to 10 mm. As a result of this, an insulating oxide thin film is less likely to be formed between the plurality of metal plates 232B. Therefore, the anode 23B can maintain the anode potential for a long period.

Fourth Embodiment

Figure 5:
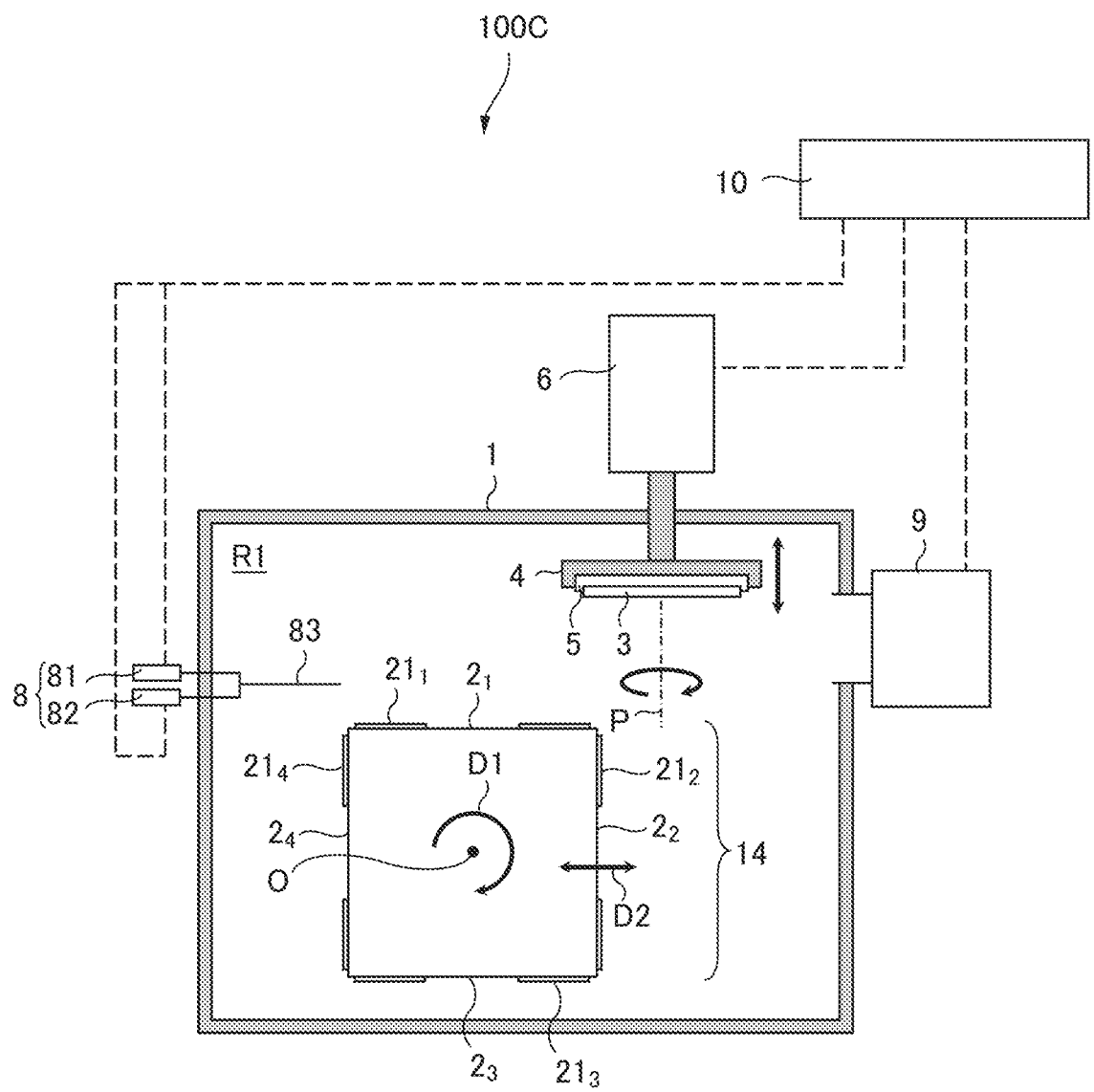
FIG. 5 is an explanatory diagram of a sputtering apparatus according to a fourth embodiment.

FIG. 5 is an explanatory diagram of a sputtering apparatus 100C according to a fourth embodiment. To be noted, elements of the sputtering apparatus 100C of the fourth embodiment substantially the same as in the sputtering apparatus 100 of the first embodiment will be denoted by the same reference signs and detailed description thereof will be omitted.

In the fourth embodiment, the sputtering apparatus 100C is a magnetron sputtering apparatus. The sputtering apparatus 100C forms, by reactive sputtering, a compound film such as an insulating thin film on the surface of a substrate 3 serving as a film formation target. A product such as a final product or an intermediate product is manufactured by forming a thin film on the surface of the substrate 3 by the sputtering apparatus 100C. The substrate 3 is, for example, a lens substrate, and the film that is formed is, for example, an antireflection film that is a laminate film constituted by a plurality of kinds of metal oxide layers. The sputtering apparatus 100C manufactures a lens as the product.

The sputtering apparatus 100C includes the chamber 1, a module 14 including a plurality of units $2_1$ to $2_4$, the holder 5 that holds the substrate 3, the support mechanism 4, and the rotating/lifting/lowering mechanism 6. A space serving as the film formation chamber R1 is defined in the chamber 1. The module 14, the holder 5, and the support mechanism 4 are disposed inside the chamber 1, that is, in the film formation chamber R1. The units $2_1$ to $2_4$ each have substantially the same configuration as the unit 2 described in the first embodiment, and therefore illustration of the configuration of the units $2_1$ to $2_4$ is omitted in FIG. 5. Targets $21_1$ to $21_4$ can be respectively placed in the units $2_1$ to $2_4$. The targets $21_1$ to $21_4$ are each a metal target. The kinds of the metals respectively employed for the targets $21_1$ to $21_4$ may be selected in accordance with the kinds of metal oxide layers to be formed. Therefore, for example, the targets $21_1$ to $21_4$ may all be the same metal, or may all be different metals. Further, the sputtering apparatus 100C includes the gas supply line 8, the exhaustion apparatus 9, and the control apparatus 10 that controls the operation of each part of the sputtering apparatus 100C.

In addition, although illustration thereof is omitted in FIG. 5, the sputtering apparatus 100C includes the plasma emission monitor 11, the wire 12, and the resistor 13 illustrated in FIG. 1 for each of the units $2_1$ to $2_4$. Further, although illustration thereof is omitted in FIG. 5, the sputtering apparatus 100C includes the power source 7 illustrated in FIG. 1. The power source 7 is configured to be selectively connectable to one of the plurality of units $2_1$ to $2_4$ by using an unillustrated switcher. As a result of this, the power source 7 can supply power to generate a plasma to the target corresponding to the selected one of the plurality of units $2_1$ to $2_4$.

Information of voltage during plasma generation is obtained from the power source 7 by the control apparatus 10. Further, the plasma emission monitor 11 provided for each of the units $2_1$ to $2_4$ is connected to the control apparatus 10. The emission intensity of light of a predetermined wavelength included in the plasma and detected by the plasma emission monitor of the unit generating the plasma is obtained by the control apparatus 10. In the control apparatus 10, a value corresponding to the voltage or the emission intensity is used as the control value, and a control signal can be generated every obtaining interval to stabilize the control value. This control signal is transmitted to the mass flow controller 82 of the reactive gas provided in the gas supply line 8, and thus the flow rate of the reactive gas is adjusted by the mass flow controller 82.

The module 14 is a module having a polygonal prism shape supported by the chamber 1 so as to be rotatable about a rotation axis O. Part of each side surface of the polygonal prism of the module 14 is the surface of the target placed in each unit. The plurality of units $2_1$ to $2_4$ are arranged in a circumferential direction D1 about the rotation axis O, and are integrally rotatable in the circumferential direction D1 about the rotation axis O.

The module 14 is rotationally driven about the rotation axis O by an unillustrated driving mechanism. By rotating the module 14, one of the plurality of units $2_1$ to $2_4$ can be caused to oppose the substrate 3. In addition, by adjusting the rotational position of the module 14 with respect to the substrate 3 by the unillustrated driving mechanism, the incident angle of sputtered particles on the substrate 3 can be adjusted, and thus the film thickness distribution of the film formed on the substrate 3 can be adjusted.

In addition, the module 14 is translationally driven in a translation direction D2 by the unillustrated driving mechanism. By adjusting the translational position of the module 14 with respect to the substrate 3 by the unillustrated driving mechanism, the incident angle of sputtered particles on the substrate 3 can be adjusted, and thus the film thickness distribution of the film formed on the substrate 3 can be adjusted.

To be noted, although a case where the module 14 has a quadrangular prism shape and the four units $2_1$ to $2_4$ are respectively disposed on four surfaces of the module 14 has been described with reference to FIG. 5, the configuration is not limited to this. The units do not have to be disposed on all four surfaces as long as the units are disposed on at least one of the four surfaces. Further, the module 14 may have any shape as long as the shape is a polygonal prism shape, and for example, the shape may be a triangular prism shape.

Next, a film formation method for forming a laminate film on the surface of the substrate 3, that is, a manufacturing method for a product will be described. First, a method for sputtering the target $21_1$ to form a first layer will be described. The unillustrated driving mechanism of the module 14 and the rotating/lifting/lowering mechanism 6 drive the target $21_1$ and the substrate 3 to adjust the target $21_1$ and the substrate 3 to predetermined positions. Next, the emission intensity or emission intensity ratio of the plasma and the voltage during plasma generation are controlled by the gas supply line 8, the control apparatus 10, and the plasma emission monitor 11 to form a metal oxide film containing the metal of the target $21_1$ on the substrate 3. The film formation is finished when the film of the first layer formed on the substrate 3 reaches a predetermined thickness.

Next, the target $21_2$ is sputtered to form a second layer on the first layer. The target $21_2$ is a metal material different from the target $21_1$. Also in this case, the film formation may be performed in the same manner as for the first layer. The film formation is performed in the same manner also for the third and subsequent layers. The laminate film can be formed on the substrate 3 by the film formation method described above.

Since the units $2_1$ to $2_4$ each have substantially the same configuration as the unit 2 of the first embodiment, variation of the plasma distribution in each of the units $2_1$ to $2_4$ is reduced even in the case where the rotational position or the translational position of the module 14 is adjusted in accordance with the shape of the substrate 3. In addition, since formation of a thin film on the anode 23 in each of the units $2_1$ to $2_4$ is reduced, the plasma can be stably generated for a long period.

Example 1 and Comparative Example 1

The stability of the plasma was examined by conducting experiments for a case of generating a plasma by a sputtering apparatus of Example 1 corresponding to the second embodiment and a case of generating a plasma by a sputtering apparatus of Comparative Example 1.

The unit (cathode portion) of the sputtering apparatus of Example 1 corresponds to a case where the anode 23A illustrated in FIG. 4B is used in place of the anode 23 in the unit 2 of the sputtering apparatus 100 illustrated in FIG. 1. In the sputtering apparatus of Comparative Example 1, the configuration of the unit (cathode portion) is different from the configuration of the unit (cathode portion) of the sputtering apparatus of Example 1. The elements of Comparative Example 1 other than the unit are substantially the same as in Example 1.

Figure 6:
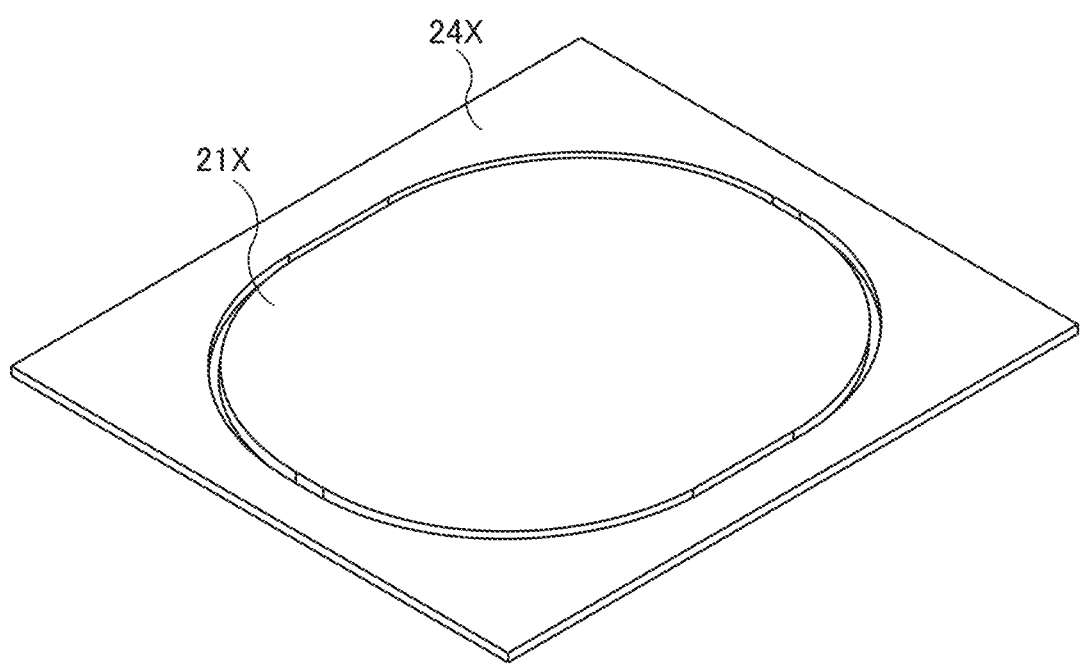
FIG. 6 is a perspective view of a target and a metal member in a unit of Comparative Example 1.

The unit (cathode portion) of the sputtering apparatus of Comparative Example 1 will be described below. FIG. 6 is a perspective view of a target 21X and a metal member 24X in the unit of Comparative Example 1. Corner portions of the target 21X are rounded. The metal member 24X is set to the ground potential. In Comparative Example 1, the metal member 24X functions as an anode, and the target 21X functions as a cathode. The metal member 24X functioning as an anode is disposed on the outer circumference of the target 21X, and is exposed without being shielded.

Sputtering conditions of the sputtering apparatus of Example 1 and the sputtering apparatus of Comparative Example 1 will be described. Targets 21 and 21X were formed from hafnium (Hf). An Ar gas was employed as the process gas, and an $O_2$ gas was employed as the reactive gas. The Ar gas and the $O_2$ gas were introduced into the chamber 1 when the pressure inside the chamber 1 reached a value less than $5 \times 10^{-4}$ Pa. The flow rate of the Ar gas was adjusted to such a value that the pressure inside the chamber 1 was about 0.2 Pa in a state in which the $O_2$ gas was not introduced into the chamber 1. Among direct current power sources, a direct current pulse power source was employed as the power source 7 that supplied power to the targets 21 and 21X. The power was adjusted such that the specific power on the surface of each of the target 21 and 21X was about 0.12 W/mm². Emission intensity of light of a wavelength related to Hf and emission intensity of light of a wavelength related to Ar were obtained by the plasma emission monitor 11. The flow rate of the $O_2$ gas was adjusted every obtaining interval by the control apparatus 10 such that the intensity ratio of the two was at a set target value.

Figure 7:
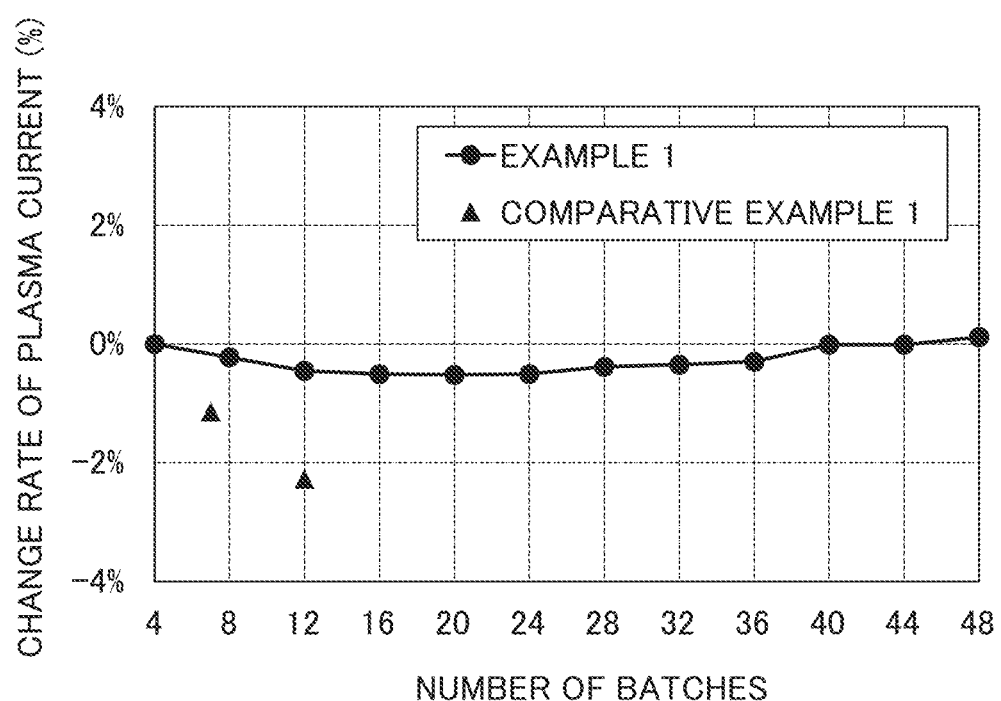
FIG. 7 is a graph illustrating experimental results of Example 1 and Comparative Example 1.

FIG. 7 is a graph illustrating experimental results of Example 1 and Comparative Example 1. FIG. 7 illustrates the change rate of the plasma current of each batch in the case where the plasma generation time per batch is set to be the same for Example 1 and Comparative Example 1. When the current of the first batch is represented by $I_1$ and the current of the n-th batch is represented by $I_n$, the change rate of the plasma current is expressed by $(I_n-I_1)/I_1$. The plasma current is a current that flows between the anode and the cathode.

As illustrated in FIG. 7, whereas the change rate of the plasma current reached about −2% in the twelfth batch in the sputtering apparatus of Comparative Example 1, the change rate of the plasma current was reduced to about 0.6% even in the forty-eighth batch in the sputtering apparatus of Example 1. The reason why such a result was obtained in Example 1 can be considered to be because formation of a metal oxide film ($HfO_2$) on the anode 23A was reduced by the metal member 24 set to the ground potential or a floating potential shielding the anode 23A. In addition, the reason why such a result was obtained in Example 1 can be considered to be because the anode 23A was disposed at a position corresponding to the opening 212 of the target 21 serving as a cathode and thus electrons in the plasma were efficiently collected by the anode 23A.

As described above, in Example 1, the current of the plasma was steady for a long period even after a large number of batches, and thus it was confirmed that the plasma was stably generated for a long period.

Example 2

A sputtering apparatus having substantially the same configuration as the sputtering apparatus used in Example 1 was used in Example 2. The stability of the plasma with respect to the distance between the target 21 and the substrate 3 in the sputtering apparatus of Example 2 was examined by an experiment. The distance will be hereinafter referred to as TS.

The target 21 was formed from hafnium (Hf). An Ar gas was employed as the process gas, and an $O_2$ gas was employed as the reactive gas. The Ar gas and the $O_2$ gas were introduced into the chamber 1 when the pressure inside the chamber 1 reached a value less than $5\times10^{-4}$ Pa. The flow rate of the Ar gas was adjusted to such a value that the pressure inside the chamber 1 was about 0.2 Pa in a state in which the $O_2$ gas was not introduced into the chamber 1. Among direct current power sources, a direct current pulse power source was employed as the power source 7 that supplied power to the target 21. The power was adjusted such that the specific power on the surface of the target 21 was about 0.12 W/mm².

Figure 8:
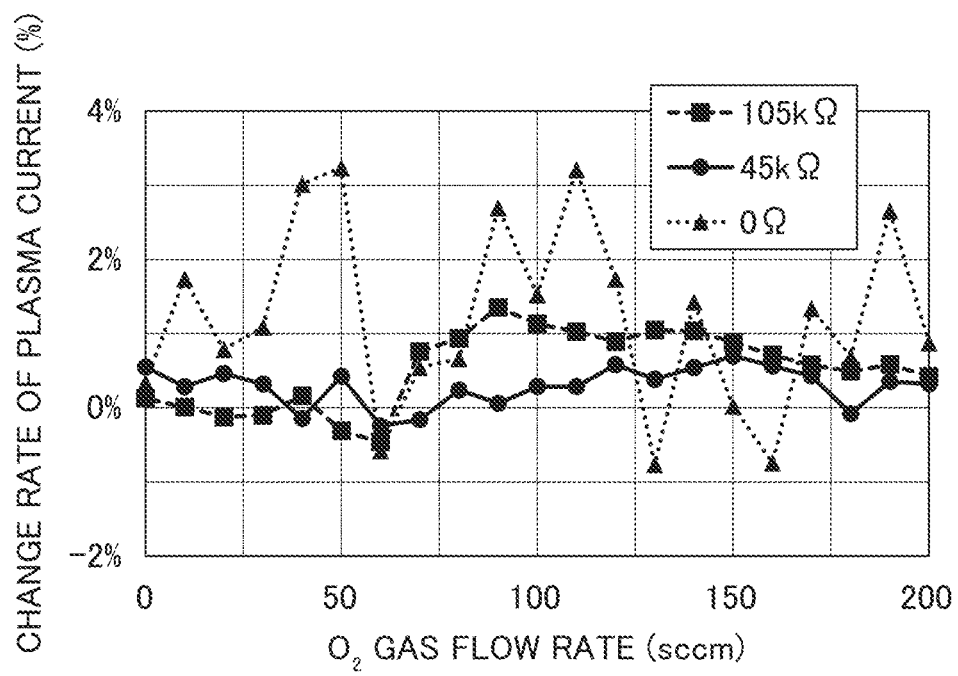
FIG. 8 is a graph illustrating experimental results of Example 2.

FIG. 8 is a graph illustrating experimental results of Example 2. FIG. 8 illustrates a plasma current ratio of TS 430 mm with respect to TS 300 mm in the case where the $O_2$ gas flow rate was changed in the range of 0 sccm to 200 sccm. FIG. 8 illustrates cases where the electric resistance Ra of the resistor 13 was set to 0Ω, 45Ω and 105 kΩ, respectively. The case where the electric resistance Ra of the resistor 13 was set to 0Ω represents a case where the resistor 13 was omitted and the anode 23A and the ground 15 were directly connected.

In the case where the electric resistance Ra was 0Ω, that is, in the case where the resistor 13 was not provided and the anode 23A was at the ground potential, the variation amount of the current ratio with respect to the flow rate of the $O_2$ gas was about 4%. In contrast, in the case where the electric resistance Ra of the resistor 13 was set to 45 kΩ or 105 kΩ and the potential of the anode 23A was higher than the ground potential, the variation amount of the current ratio with respect to the flow rate of the $O_2$ gas was 0.9% to 1.8%. That is, the variation amount of the case where the potential of the anode 23A was higher than the ground potential was reduced to about ¼ to ½ of the variation amount of the case where the potential of the anode 23A was set to the ground potential. That is, the current of the generated plasma changes in accordance with TS in the case where the resistor 13 is not provided, but is approximately constant regardless of TS in the case where the resistor 13 is provided.

Here, the anode 23A was disposed at a position corresponding to the opening 212 of the target 21 where the plasma was generated, via the metal member 24. Further, the metal member 24 was set to the ground potential or the floating potential, and the anode 23A was set to a potential higher than the ground potential and the floating potential. To be noted, in the case where the metal member 24 is at the floating potential, electrons in the plasma are supplied to the metal member 24, and therefore the potential of the metal member 24 becomes a negative potential lower than the ground potential.

The reason why the variation amount of the current ratio was reduced by setting the potential of the anode 23A to a potential higher than the potential of the metal member 24, that is. the ground potential or the floating potential can be considered to be because the variation of the electric field around the target derived from TS was reduced. It can be considered that, since the variation of the scattering loss amount of electrons is also small when the variation of the electric field is small, the variation of the current of the plasma, that is, the variation of the electron density was also reduced as a result.

As described above, in Example 2, the electric resistance Ra of the resistor 13 was set such that the anode potential was higher than the ground potential. As a result of this, a result that the plasma was stably generated regardless of TS was obtained.

Fifth Embodiment

Figure 9:
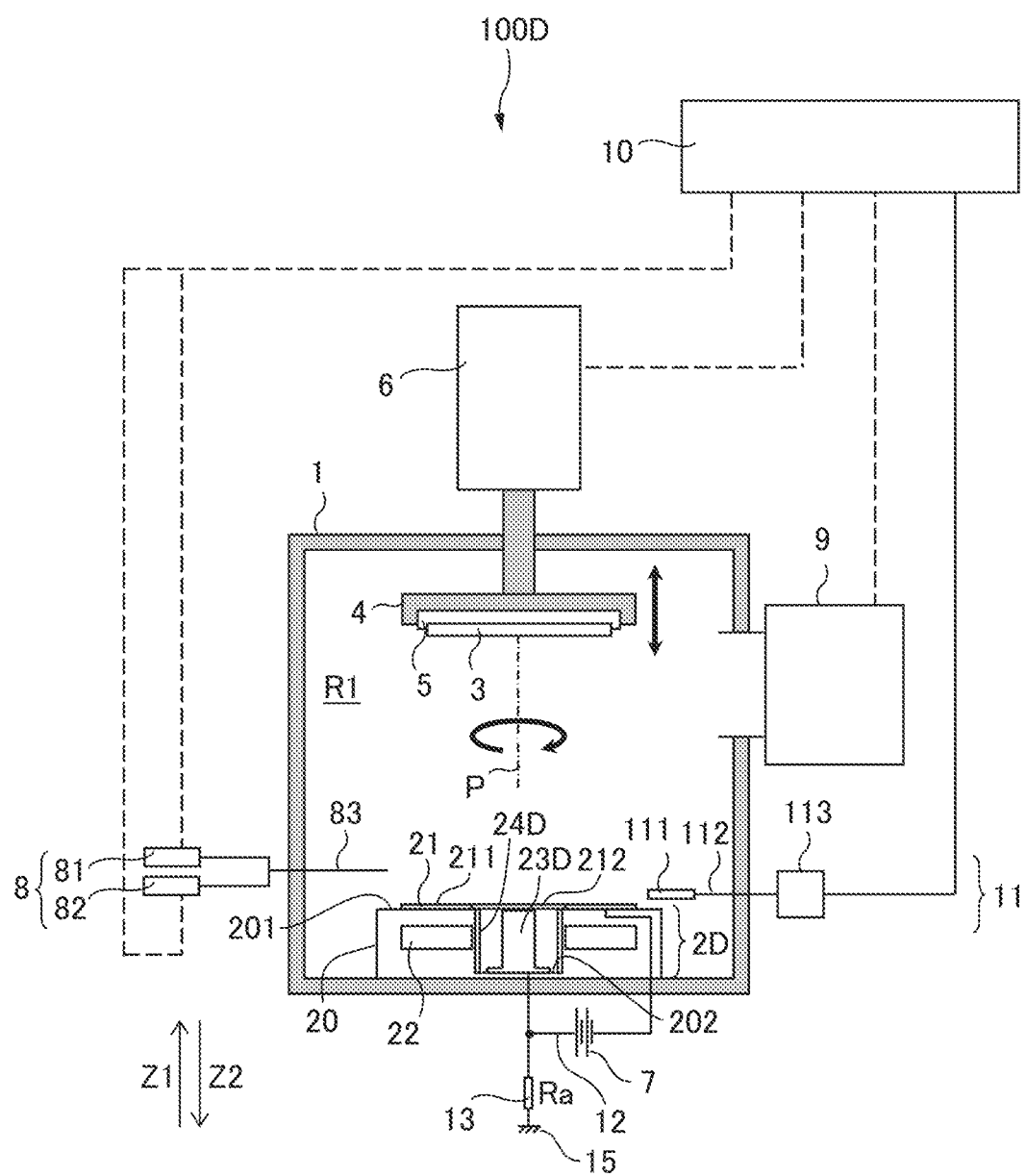
FIG. 9 is an explanatory diagram of a sputtering apparatus according to a fifth embodiment.

FIG. 9 is an explanatory diagram of a sputtering apparatus 100D according to a fifth embodiment. To be noted, elements of the sputtering apparatus 100D of the fifth embodiment substantially the same as in the sputtering apparatus 100 of the first embodiment will be denoted by the same reference signs and detailed description thereof will be omitted.

The sputtering apparatus 100D includes a unit (cathode portion) 2D different from the unit 2 in place of the unit 2 of the first embodiment. In addition, similarly to the first embodiment, the sputtering apparatus 100D includes the chamber 1, the holder 5 holding the substrate 3, the support mechanism 4, and the rotating/lifting/lowering mechanism 6. Further, similarly to the first embodiment, the sputtering apparatus 100D includes the power source 7 that supplies power to the unit 2D, the gas supply line 8, the exhaustion apparatus 9, the control apparatus 10, and the plasma emission monitor 11.

In the unit 2D, the target 21 functioning as a cathode is placed. A space serving as the film formation chamber R1 is defined in the chamber 1. The unit 2D, the holder 5, and the support mechanism 4 are disposed inside the chamber 1, that is, in the film formation chamber R1. The unit 2D includes the unit body 20 having substantially the same configuration as in the first embodiment serving as an example of a placement portion.

Figure 10:
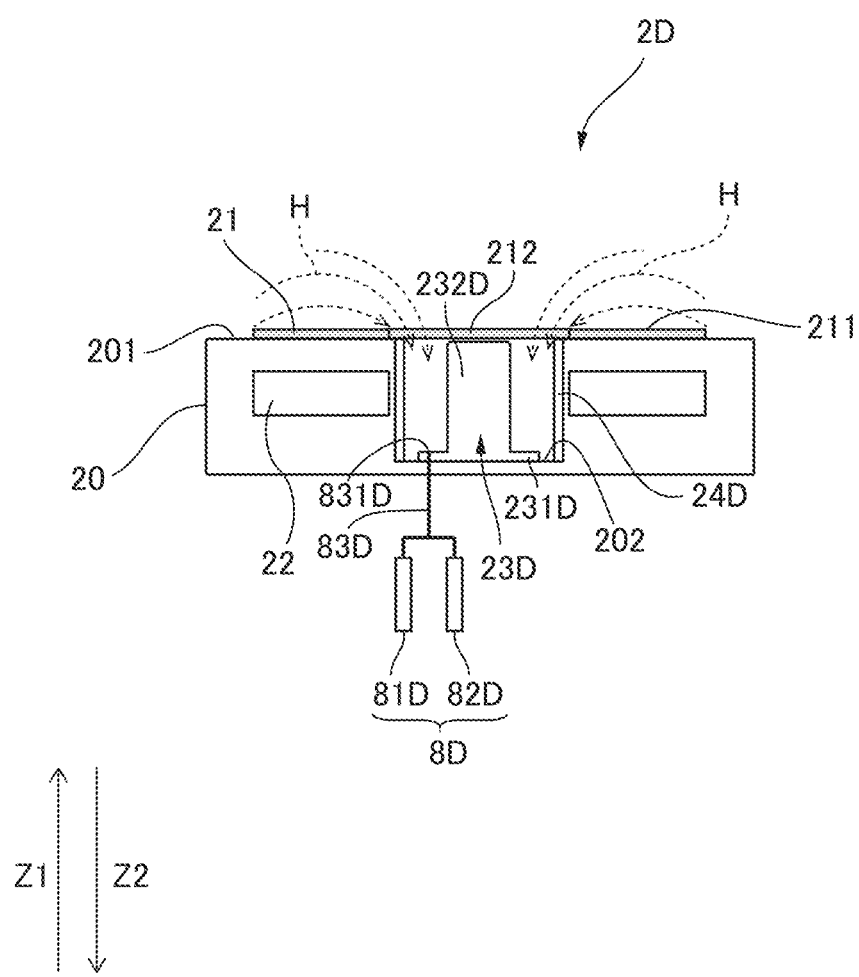
FIG. 10 is an explanatory diagram of a unit and a target according to the fifth embodiment.

FIG. 10 is an explanatory diagram of the unit 2D and the target 21 illustrated in FIG. 9. The unit body 20 includes the main surface 201 to which the target 21 is attached. The surface 211 of the target 21 that is sputtered is parallel to the main surface 201. The unit body 20 includes the recess portion 202 recessed in the Z2 direction with respect to the main surface 201. The target 21 has the opening 212 defined at a position corresponding to the recess portion 202 as viewed in the Z1/Z2 direction. The opening 212 serves as an example of a first opening. That is, the target 21 is disposed on the main surface 201 such that the opening 212 corresponds to the recess portion 202 as viewed in the Z1/Z2 direction. The opening 212 is defined at a center portion of the target 21.

The unit 2D includes an anode 23D and a metal member 24D that are disposed at positions (space) corresponding to the opening 212 of the target 21 as viewed in the Z1/Z2 direction and are electrically insulated from each other in the unit body 20. As a result of the anode 23D and the metal member 24D being electrically insulated from each other in the unit body 20, the short circuit between the anode 23D and the metal member 24D can be prevented, and the anode 23D and the metal member 24D can be maintained at different potentials from each other. To be noted, in the fifth embodiment, the target 21 serving as a cathode, the anode 23D, and the metal member 24D are electrically insulated from each other, and therefore the target 21, the anode 23D, and the metal member 24D can be maintained at different potentials from each other.

The anode 23D and the metal member 24D are formed from metal such as stainless steel. Since the anode 23D is disposed at a position corresponding to the opening 212 of the target 21 serving as a cathode, scattering of the generated plasma from the vicinity of the target 21 is reduced, and thus a plasma that is uniformly distributed in the vicinity of the target 21 can be generated.

The power source 7 is connected to the target 21 and the anode 23D. Specifically, the anode 23D is electrically connected to a positive electrode (+ electrode) of the power source 7, and the target 21 is electrically connected to a negative electrode (− electrode) of the power source 7. As a result of this, power to generate the plasma is supplied to the target 21 and the anode 23D.

In addition, the unit 2D includes the magnet 22 disposed under the target 21 in the unit body 20. The magnet 22 is constituted by a plurality of magnet members arranged to have different polarity directions such that the magnetic field H along the surface 211 of the target 21 is formed in a direction from above the target 21 toward the opening 212, that is, toward the recess portion 202. As a result of the magnetic field H formed by the magnet 22, electrons in the plasma are retained in the vicinity of the surface 211 of the target 21 without scattering therefrom, and thus sputtering can be performed efficiently at a low voltage. Further, since the magnetic field H along the surface 211 of the target 21 is oriented to converge at the anode 23D, the electrons can efficiently flow into the anode 23D.

In addition, the unit 2D has an unillustrated cooling structure for cooling the target 21 from the back surface side to suppress rise of the temperature of the surface 211 of the target 21 beyond a predetermined temperature caused by the plasma generated on the surface 211 of the target 21.

An unillustrated sticking prevention plate is disposed in the chamber 1 so as to cover the inner wall thereof. The unillustrated sticking prevention plate, the substrate 3, the holder 5, the support mechanism 4, and the plasma emission monitor 11 are each set to a floating potential. The gas supply line 8 is set to a ground potential in the fifth embodiment. However, the gas supply line 8 is not limited to the ground potential, and may be set to a floating potential.

To make the potential of the anode 23D higher than the ground potential, the resistor 13 connected to the ground 15 is connected to the wire 12 interconnecting the anode 23D and the power source 7. As described above, since the anode 23D connected to the positive electrode of the power source 7 is electrically connected to the ground 15 via the resistor 13, the potential of the anode 23D is a positive potential higher than the ground potential.

In the case of performing reactive sputtering, the target 21 is a metal target. A process gas and a reactive gas for sputtering are supplied from the gas supply line 8. The supply flow rates of the process gas and the reactive gas are respectively adjusted by the mass flow controllers 81 and 82, and the gases are supplied into the chamber 1 from the gas supply pipe 83 after being mixed together. To be noted, the gas supply pipe 83 is not limited to a structure that mixes the process gas and the reactive gas, and may have a structure that separately supplies the process gas and the reactive gas.

The process gas may be any gas as long as the gas collides with electrons in the plasma to ionize into positive ions and can sputter the metal target, and is preferably, for example, an argon (Ar) gas. The reactive gas is supplied when performing reactive sputtering in a reactive (oxide) mode or a transition mode. For example, when performing reactive sputtering while oxidizing the surface 211 of the metal target 21, an oxygen ($O_2$) gas is used as the reactive gas.

Next, a film formation method for forming a compound film on the surface of the substrate 3, that is, a manufacturing method for a product will be described. When forming a compound film on the substrate 3, first, the target 21 is placed on the unit body 20 of the unit 2D, and the support mechanism 4 supports the substrate 3. Oxygen ($O_2$) and argon (Ar) are supplied to the decompressed film formation chamber R1 as a reactive gas and a process gas, respectively. Then, a film containing metal oxide is formed on the surface of the substrate 3 as a compound film by reactive sputtering.

Figure 11A:
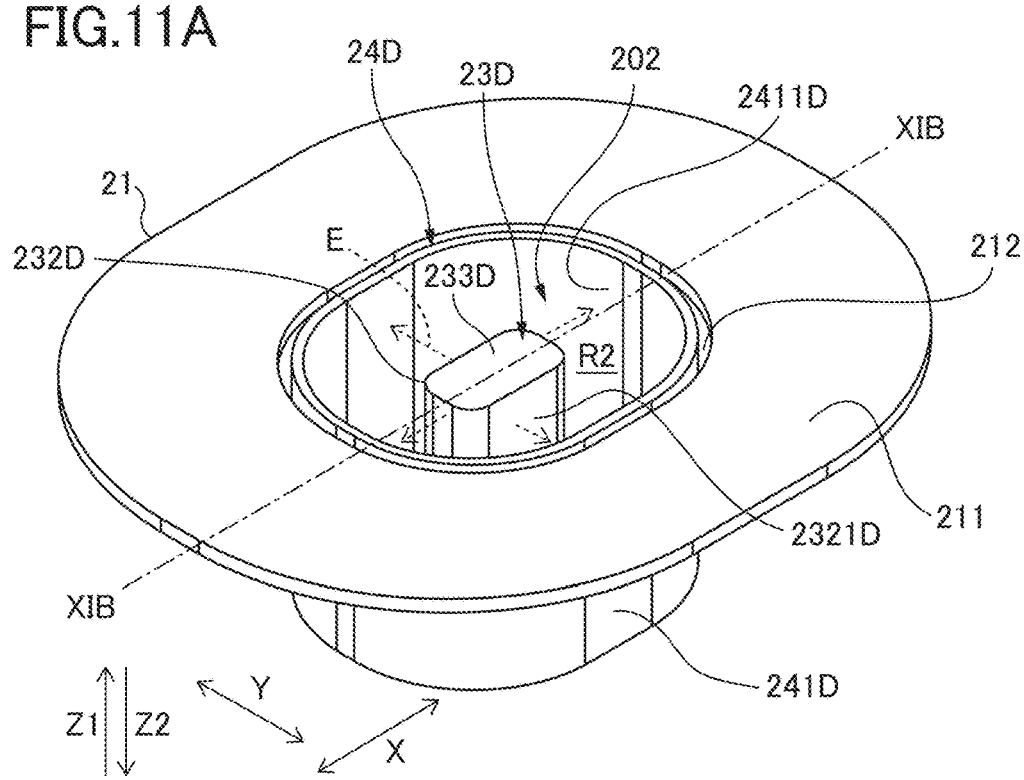
FIG. 11A is a perspective view of the target, an anode, and a metal member according to the fifth embodiment.
Figure 11B:
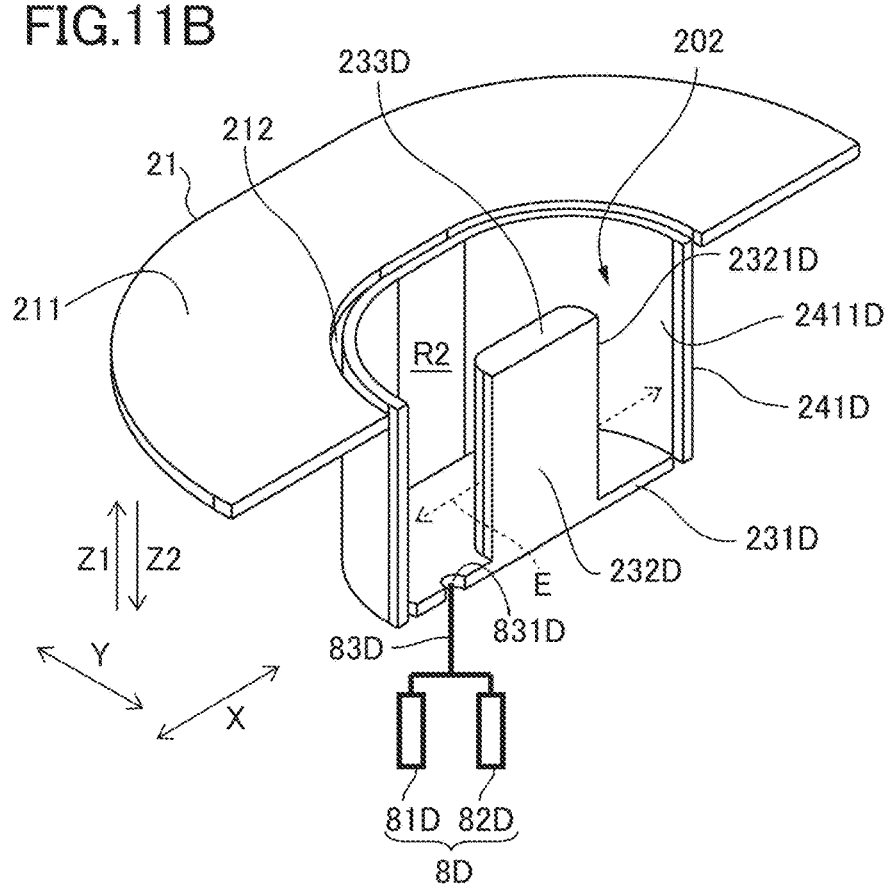
FIG. 11B is a perspective view of the target, the anode, and the metal member according to the fifth embodiment cut along a line XIB-XIB of FIG. 11A.

FIG. 11A is a perspective view of the target 21, the anode 23D, and the metal member 24D according to the fifth embodiment. FIG. 11B is a perspective view of the target 21, the anode 23D, and the metal member 24D cut along a line XIB-XIB of FIG. 11A. The opening 212 is defined in a center portion of the target 21. The target 21 is formed in an oval shape as viewed in the Z1/Z2 direction. Here, in the case where the target has a shape having an angular portion, when an insulating metal oxide film is accumulated at the angular portion of the target, arcing caused by ionization and electrification of the metal oxide film is likely to occur. In contrast, in the fifth embodiment, the target 21 has a shape in which no angular portion is provided on the inner circumference and the outer circumference. As a result of forming the target 21 in such a shape, arcing caused by formation of the insulating metal oxide film can be reduced. To be noted, although the target 21 is formed in an oval shape, the shape is not limited to this, and may be, for example, a ring shape.

The anode 23D and the metal member 24D are disposed in the recess portion 202 of the unit body 20. The anode 23D includes a base portion 231D supported by the unit body 20 in the recess portion 202, and a projection portion 232D projecting in the Z1 direction with respect to the base portion 231D. The anode 23D is disposed in the recess portion 202 such that a distal end 233D of the projection portion 232D does not project more in the Z1 direction than the surface 211 of the target 21. To be noted, the distal end 233D is, for example, a flat surface. The projection portion 232D is formed in a pillar shape, for example, a prism shape. In the case where the projection portion 232D has a prism shape, corner portions thereof are preferably rounded in order to reduce electric field concentration, that is, local inflow of electrons. To be noted, the projection portion 232D is not limited to have a prism shape, and may have a columnar shape.

The metal member 24D includes a side wall portion 241D disposed to oppose a side surface 2321D of the projection portion 232D. That is, the side wall portion 241D includes an inner side surface 2411D opposing the side surface 2321D of the projection portion 232D. The metal member 24D is electrically insulated from the anode 23D and the target 21 so as to have a different potential from the anode 23D and the target 21. Specifically, the metal member 24D is set to the ground potential or a floating potential. To be noted, in the case where the metal member 24D is at the floating potential, electrons in the plasma are supplied to the metal member 24, and therefore the potential of the metal member 24D becomes a negative potential lower than the ground potential.

In the recess portion 202, the anode 23D is disposed with an interval from the metal member 24D, that is, from the side wall portion 241D so as to be not in contact with the metal member 24D. Specifically, the projection portion 232D of the anode 23D and the side wall portion 241D of the metal member 24D oppose each other in an X direction and a Y direction perpendicular to the Z1 direction with an interval therebetween. To be noted, the X direction is, for example, the major axis direction of the target 21, and the Y direction is, for example, the minor axis direction of the target 21 perpendicular to the X direction.

In addition, although the side surface 2321D of the projection portion 232D of the anode 23D and the inner side surface 2411D of the side wall portion 241D of the metal member 24D are preferably parallel to each other, the configuration is not limited to this.

In addition, the separation distance between the side surface 2321D of the anode 23D and the inner side surface 2411D of the metal member 24D is preferably larger than the thickness of the plasma sheath. Although the thickness of the plasma sheath changes in accordance with the magnetic field, the sputtering conditions, and the like, the minimum value of the separation distance is preferably 8 mm or more in the X-Y direction parallel to the surface 211 of the target 21. According to such a configuration, the electrons in the plasma becomes more likely to flow into a space R2 defined between the projection portion 232D and the side wall portion 241D.

Further, in this space R2, an electric field E directed from the side surface 2321D of the anode 23D toward the inner side surface 2411D of the metal member 24D is formed. In FIGS. 11A and 11B, the electric field E is indicated by broken line arrows. The electrons flowing into the space R2 between the side surface 2321D of the anode 23D and the inner side surface 2411D of the metal member 24D flow toward the anode 23D due to the electric field E, and are efficiently collected by the anode 23D.

In addition, in the space R2 between the side surface 2321D of the anode 23D and the inner side surface 2411D of the metal member 24D, the electron density is high. The reactive gas or the sputtered particles of the target 21, which have a free path smaller than the separation distance, also flow into the space R2 having high electron density. In the case of employing an $O_2$ gas as the reactive gas, since the $O_2$ gas has high electron affinity and is likely to become negative ions, negative ions of the oxygen gas can be efficiently generated in the space R2.

The negative ions of the oxygen gas are accelerated toward the side surface 2321D of the anode 23D by the electric field E in the space R2. That is, since the negative ions of the oxygen gas are negative charges, the negative ions are accelerated in a direction opposite to the direction of the electric field E. When the kinetic energy of the negative ions of the oxygen gas are made higher than the interatomic binding energy of the oxide thin film, that is, the sputtering threshold energy, the oxide thin film formed on the side surface 2321D of the anode 23D is physically etched by the negative ions of the oxygen gas. As a result of the oxide thin film being physically etched, that is, sputtered on the side surface 2321D of the anode 23D, accumulation of the oxide thin film on the side surface 2321D of the anode 23D can be reduced. As a result of this, elimination of the potential of the anode 23D, that is, the anode potential can be suppressed. That is, reduction of a current flowing to the anode 23D can be reduced. As described above, since formation of the metal oxide film on the anode 23D can be reduced, the plasma can be stably generated for a long period.

The magnitude of the kinetic energy of the negative ions of the reactive gas is determined by the magnitude of the electric field E, that is, the potential of the anode 23D. The potential of the anode 23D can be adjusted by adjusting the electric resistance Ra of the resistor 13. Since the interatomic binding energy of the oxide thin film differs depending on the material of the target 21, the kinetic energy of the negative ions for physically etching the oxide thin film may be adjusted by adjusting the electric resistance Ra of the resistor 13.

As described above, the fifth embodiment has a compact configuration in which the anode 23D having a potential higher than the ground potential and the metal member 24D set to the ground potential or the floating potential are disposed in the space R2 corresponding to the opening 212 of the target 21. According to such a configuration, the sputtering apparatus 100D can be miniaturized, the elimination of the anode potential in the reactive sputtering can be suppressed, and thus the film formation can be stably performed for a long period.

The sputtering apparatus 100D of the fifth embodiment preferably includes a gas supply line 8D that supplies gases required for film formation. The gas supply line 8D includes a gas supply pipe 83D serving as an example of a gas supply portion that supplies the process gas and the reactive gas for sputtering into the chamber 1, that is, to the film formation chamber R1. The supply flow rates of the process gas and the reactive gas are respectively adjusted by mass flow controllers 81D and 82D, and the gases are supplied into the chamber 1 from the gas supply pipe 83D after being mixed together.

The gas supply pipe 83D has a supply port 831D opening to the inside of the chamber 1. For example, the supply port 831D is connected to a through hole defined in the base portion 231D as illustrated in FIG. 11B, and is positioned in the recess portion 202. As a result of this, the reactive gas can be directly supplied to the space R2, and thus the number density of the reactive gas in the space R2 can be adjusted. To be noted, the gas supply line 8D is not limited to a structure that mixes the process gas and the reactive gas, and may be a structure that separately supplies the process gas and the reactive gas. In addition, the supply port 831D may be connected to a through hole defined in the metal member 24D instead of the anode 23D.

In the case where it is assumed that the amount of the reactive gas supplied from the gas supply line 8 is small or the amount of generated negative ions of the reactive gas is small, the reactive gas can be added to the space R2 by the gas supply line 8D to increase the number density of the reactive gas. As a result of this, the flux of the negative ions of the reactive gas accelerated toward the anode 23D can be increased, and thus the physical etching of the oxide thin film accumulated on the side surface 2321D of the anode 23D can be prompted.

In addition, in the case where it is assumed that the physical etching by the negative ions of the reactive gas is excessive, the process gas can be added to the space R2 by the gas supply line 8D to reduce the number density of the reactive gas. As a result of this, the flux of the negative ions of the reactive gas accelerated toward the anode 23D can be reduced, and thus the physical etching of the oxide thin film on the side surface 2321D of the anode 23D can be efficiently reduced.

In addition, the electric resistance Ra of the resistor 13 may be reduced to reduce the physical etching. As a result of this, the magnitude of the electric field E that accelerates the negative ions is reduced, thus the kinetic energy of the negative ions can be reduced, and therefore the physical etching can be efficiently reduced.

To be noted, although the power source 7 is a direct current power source in the fifth embodiment, the power source 7 may be an alternate current power source. In this case, the alternate current power source is connected to the anode 23D and the target 21, and an alternate current power is supplied to the anode 23D and the target 21. In this case, the resistor 13 can be omitted.

In addition, although a case where the sputtering apparatus 100D includes the gas supply line 8 and the gas supply line 8D has been described, the configuration is not limited to this, and the gas supply line 8 may be omitted.

Sixth Embodiment

Figure 12:
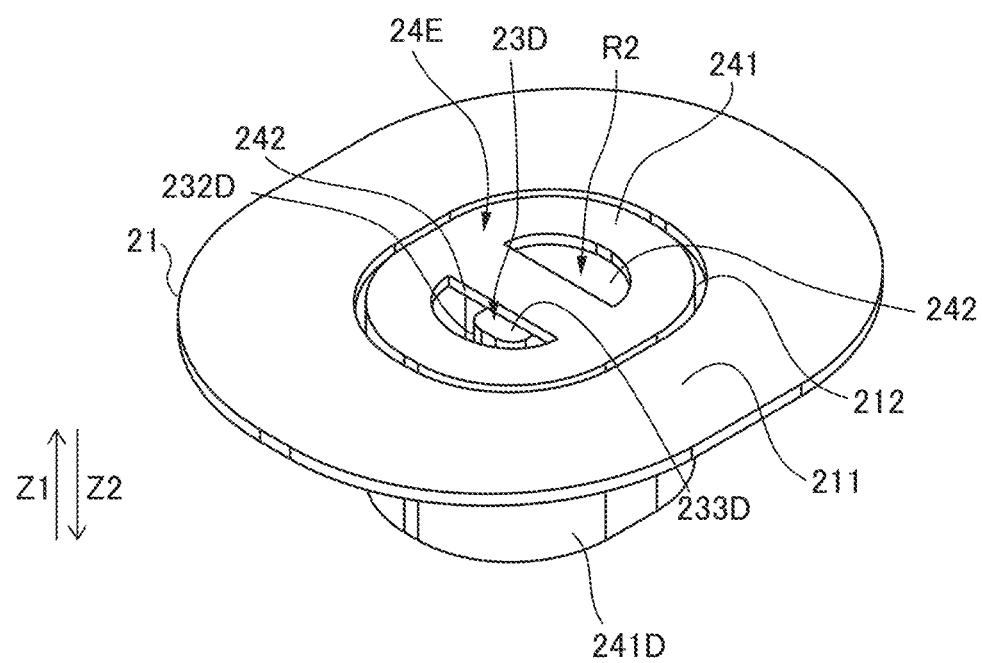
FIG. 12 is a perspective view of a target, an anode, and a metal member according to a sixth embodiment.

Next, a metal member according to a sixth embodiment will be described. FIG. 12 is a perspective view of the target 21, the anode 23D, and a metal member 24E according to the sixth embodiment. The sputtering apparatus of the sixth embodiment has a configuration in which the metal member 24D of the sputtering apparatus 100D of the fifth embodiment is replaced by the metal member 24E. The metal member 24E includes the side wall portion 241D described in the fifth embodiment and the shielding portion 241 described in the first embodiment. To be noted, the target 21 has the configuration described in the first embodiment, and the anode 23D has the configuration described in the fifth embodiment.

The shielding portion 241 is disposed at a position opposing the anode 23D in the Z1/Z2 direction. The distal end 233D of the projection portion 232D of the anode 23D and the shielding portion 241 of the metal member 24E are disposed at an interval in the Z1/Z2 direction. As a result of this, the anode 23D and the metal member 24E are electrically insulated from each other, and maintained at different potentials. That is, the anode 23D is maintained at an anode potential, that is, a positive potential, and the metal member 24E is maintained at the ground potential or a floating potential that is lower than the anode potential.

Since the shielding portion 241 of the metal member 24E is at a position away from the anode 23D in the Z1 direction, the anode 23D is shielded by the shielding portion 241, and therefore formation of the insulating metal oxide film on the anode 23D can be reduced. As a result of this, elimination of the potential of the anode 23D, that is, the anode potential can be suppressed. That is, reduction of a current flowing to the anode 23D can be suppressed. As described above, since formation of the metal oxide film on the anode 23D can be reduced, the plasma can be stably generated for a long period.

In addition, even if the metal oxide film is formed on a side surface of the projection portion 232D of the anode 23D, the metal oxide film is physically etched by the negative ions of the oxygen gas. As a result of this, formation of the metal oxide film on the anode 23D can be reduced, and the plasma can be stably generated for a long period.

In the sixth embodiment, the shielding portion 241 has a plurality of, for example, two openings 242 as at least one second opening. The openings 242 are each smaller than the opening 212. As a result of this, electrons in the plasma generated in the vicinity of the target 21 serving as a cathode are more likely to flow to the anode 23D through the openings 242 of the shielding portion 241.

In FIG. 12, the openings 242 are each formed in a semicircular shape, but the shape is not limited to this. The openings 242 each may have any shape as long as electrons can pass therethrough, and for example, the shape may be a circular shape or a rectangular shape. In the case of forming each of the openings 242 in a semicircular or circular shape, although it depends on the magnetic field (magnetic flux density) formed by the magnet 22 illustrated in FIG. 10, the sputtering conditions, and the like, the radius of each of the openings 242 is preferably 7.5 mm or more. In addition, in the case of forming each of the openings 242 in a rectangular shape, the length of the short side of each of the openings 242 is preferably 15 mm or more.

In the sixth embodiment, the shielding portion 241 is disposed at the same height as the target 21 in the Z1/Z2 direction. As a result of this, the anode 23D is effectively shielded by the shielding portion 241, and thus formation of the metal oxide film on the anode 23D can be effectively reduced.

As described above, according to the sixth embodiment, the anode 23D is shielded by the metal member 24E, and therefore formation of a compound film on the anode 23D is reduced. As a result of this, the plasma can be stably generated for a long period.

The separation distance between the distal end 233D of the anode 23D and the back surface of the shielding portion 241 of the metal member 24E in the Z1/Z2 direction is preferably 8 mm or more such that the separation distance is larger than the thickness of the plasma sheath that changes depending on the magnetic field, the sputtering conditions, and the like in the Z1/Z2 direction. As a result of this, electrons can flow to the space R2, and thus an electric field from the distal end 233D of the anode 23D toward the back surface the shielding portion 241 can be formed. The magnitude of this electric field is approximately equal to that of the electric field E described in the fifth embodiment.

Therefore, accumulation of the oxide thin film on the distal end 233D of the projection portion 232D of the anode 23D can be also reduced by physical etching by the negative ions of the reactive gas as on the side surface of the projection portion 232D of the anode 23D.

Seventh Embodiment

Figure 13:
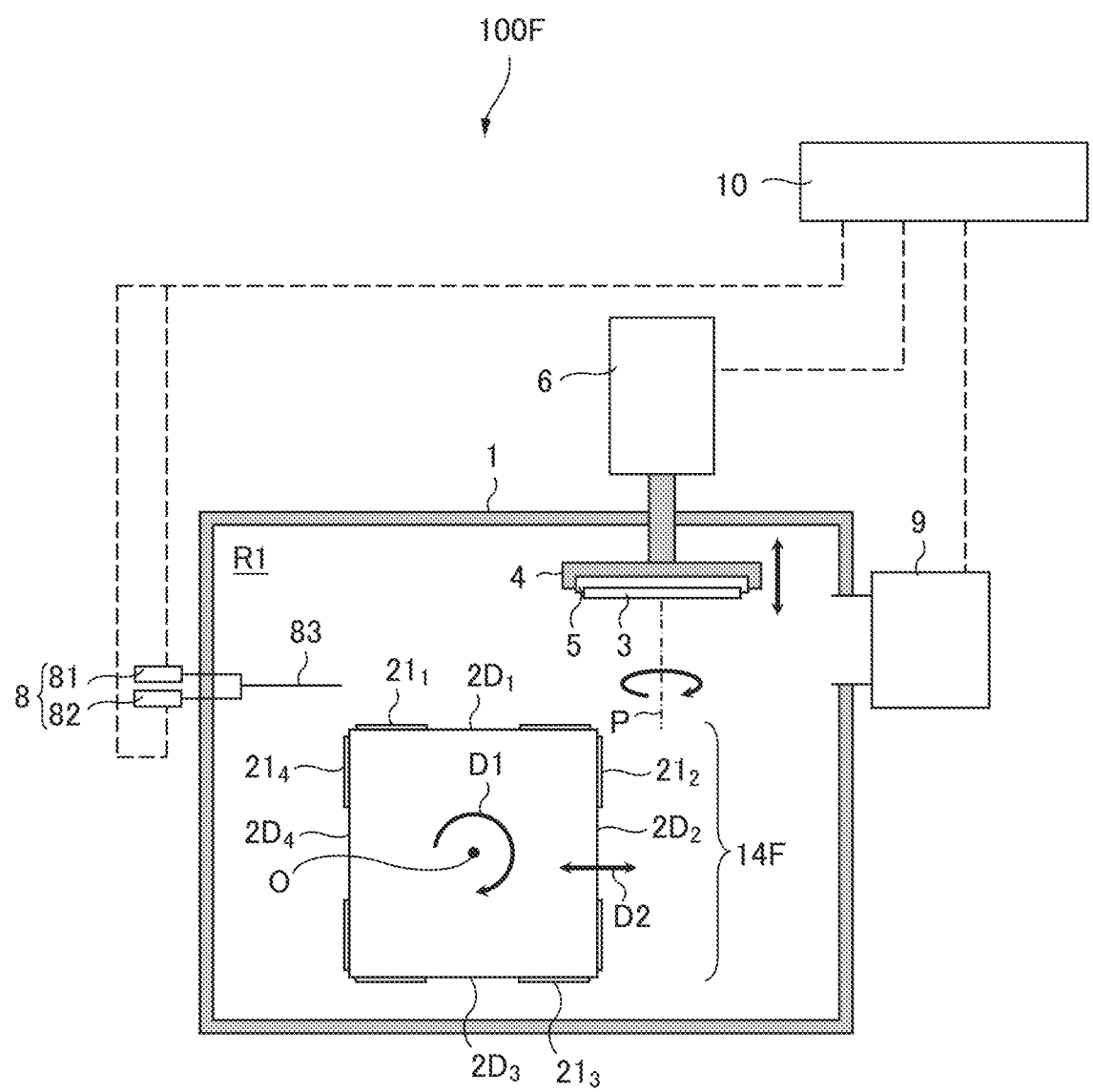
FIG. 13 is an explanatory diagram of a sputtering apparatus according to a seventh embodiment.

FIG. 13 is an explanatory diagram of a sputtering apparatus 100F according to a seventh embodiment. To be noted, elements of the sputtering apparatus 100F of the seventh embodiment substantially the same as in the sputtering apparatus 100D of the fifth embodiment will be denoted by the same reference signs and detailed description thereof will be omitted.

In the seventh embodiment, the sputtering apparatus 100F is a magnetron sputtering apparatus. The sputtering apparatus 100F forms, by reactive sputtering, a compound film such as an insulating thin film on the surface of a substrate 3 serving as a film formation target. A product such as a final product or an intermediate product is manufactured by forming a thin film on the surface of the substrate 3 by the sputtering apparatus 100F. The substrate 3 is, for example, a lens substrate, and the film that is formed is, for example, an antireflection film that is a laminate film constituted by a plurality of kinds of metal oxide layers. The sputtering apparatus 100F manufactures a lens as the product.

The sputtering apparatus 100F includes the chamber 1, a module 14F including a plurality of units $2D_1$ to $2D_4$, the holder 5 that holds the substrate 3, the support mechanism 4, and the rotating/lifting/lowering mechanism 6. A space serving as the film formation chamber R1 is defined in the chamber 1. The module 14F, the holder 5, and the support mechanism 4 are disposed inside the chamber 1, that is, in the film formation chamber R1. The units $2D_1$ to $2D_4$ each have substantially the same configuration as the unit 2D described in the fifth embodiment, and therefore illustration of the configuration of the units $2D_1$ to $2D_4$ is omitted in FIG. 13. Targets $21_1$ to $21_4$ can be respectively placed in the units $2D_1$ to $2D_4$. The targets $21_1$ to $21_4$ are each a metal target. The kinds of the metals respectively employed for the targets $21_1$ to $21_4$ may be selected in accordance with the kinds of metal oxide layers to be formed. Therefore, for example, the targets $21_1$ to $21_4$ may all be the same metal, or may all be different metals. Further, the sputtering apparatus 100F includes the gas supply line 8, the exhaustion apparatus 9, and the control apparatus 10 that controls the operation of each part of the sputtering apparatus 100F.

In addition, although illustration thereof is omitted in FIG. 13, the sputtering apparatus 100F includes the plasma emission monitor 11, the wire 12, and the resistor 13 illustrated in FIG. 9 for each of the units $2D_1$ to $2D_4$. Further, although illustration thereof is omitted in FIG. 13, the sputtering apparatus 100F includes the power source 7 illustrated in FIG. 9. The power source 7 is configured to be selectively connectable to one of the plurality of units $2D_1$ to $2D_4$ by using an unillustrated switcher. As a result of this, the power source 7 can supply power to generate a plasma to the target corresponding to the selected one of the plurality of units $2D_1$ to $2D_4$.

Information of voltage during plasma generation is obtained from the power source 7 by the control apparatus 10. Further, the plasma emission monitor 11 provided for each of the units $2D_1$ to $2D_4$ is connected to the control apparatus 10. The emission intensity of light of a predetermined wavelength included in the plasma and detected by the plasma emission monitor of the unit generating the plasma is obtained by the control apparatus 10. In the control apparatus 10, a value corresponding to the voltage or the emission intensity is used as the control value, and a control signal can be generated every obtaining interval to stabilize the control value. This control signal is transmitted to the mass flow controller 82 of the reactive gas provided in the gas supply line 8, and thus the flow rate of the reactive gas is adjusted by the mass flow controller 82.

The module 14F is a module having a polygonal prism shape supported by the chamber 1 so as to be rotatable about the rotation axis O. Part of each side surface of the polygonal prism of the module 14F is the surface of the target placed in each unit. The plurality of units $2D_1$ to $2D_4$ are arranged in a circumferential direction D1 about the rotation axis O, and are integrally rotatable in the circumferential direction D1 about the rotation axis O.

The module 14F is rotationally driven about an unillustrated driving mechanism. By rotating the module 14F, one of the plurality of units $2D_1$ to $2D_4$ can be caused to oppose the substrate 3. In addition, by adjusting the rotational position of the module 14F with respect to the substrate 3 by the unillustrated driving mechanism, the incident angle of sputtered particles on the substrate 3 can be adjusted, and thus the film thickness distribution of the film formed on the substrate 3 can be adjusted.

In addition, the module 14F is translationally driven in a translation direction D2 by the unillustrated driving mechanism. By adjusting the translational position of the module 14F with respect to the substrate 3 by the unillustrated driving mechanism, the incident angle of sputtered particles on the substrate 3 can be adjusted, and thus the film thickness distribution of the film formed on the substrate 3 can be adjusted.

To be noted, although a case where the module 14F has a quadrangular prism shape and the four units $2D_1$ to $2D_4$ are respectively disposed on four surfaces of the module 14F has been described with reference to FIG. 13, the configuration is not limited to this. The units do not have to be disposed on all four surfaces as long as the units are disposed on at least one of the four surfaces. Further, the module 14F may have any shape as long as the shape is a polygonal prism shape, and for example the shape may be a triangular prism shape.

Next, a film formation method for forming a laminate film on the surface of the substrate 3, that is, a manufacturing method for a product will be described. First, a method for sputtering the target $21_1$ to form a first layer will be described. The unillustrated driving mechanism of the module 14F and the rotating/lifting/lowering mechanism 6 drive the target $21_1$ and the substrate 3 to adjust the target $21_1$ and the substrate 3 to predetermined positions. Next, the emission intensity or emission intensity ratio of the plasma and the voltage during plasma generation are controlled by the gas supply line 8, the control apparatus 10, and the plasma emission monitor 11 to form a metal oxide film containing the metal of the target $21_1$ on the substrate 3. The film formation is finished when the film of the first layer formed on the substrate 3 reaches a predetermined thickness.

Next, the target $21_2$ is sputtered to form a second layer on the first layer. The target $21_2$ is a metal material different from the target $21_1$. Also in this case, the film formation may be performed in the same manner as for the first layer. The film formation is performed in the same manner also for the third and subsequent layers. The laminate film can be formed on the substrate 3 by the film formation method described above.

Since the units $2D_1$ to $2D_4$ each have substantially the same configuration as the unit 2D of the fifth embodiment, variation of the plasma distribution in each of the units $2D_1$ to $2D_4$ is reduced even in the case where the rotational position or the translational position of the module 14F is adjusted in accordance with the shape of the substrate 3. In addition, since formation of a thin film on the anode 23D in each of the units $2D_1$ to $2D_4$ is reduced, the plasma can be stably generated for a long period.

Example 3

The stability of the plasma was examined by conducting experiments for a case of generating a plasma by a sputtering apparatus of Example 3 corresponding to the sixth embodiment. The unit (cathode portion) of the sputtering apparatus of Example 3 corresponds to a case where the metal member 24E illustrated in FIG. 12 is used in place of the metal member 24D in the unit 2D of the sputtering apparatus 100D illustrated in FIG. 9.

The target 21 was formed from silicon (Si). An Ar gas was employed as the process gas, and an $O_2$ gas was employed as the reactive gas. The Ar gas and the $O_2$ gas were introduced into the chamber 1 when the pressure inside the chamber 1 reached a value less than $5 \times 10^{-4}$ Pa. The flow rate of the Ar gas was adjusted to such a value that the pressure inside the chamber 1 was about 0.2 Pa in a state in which the $O_2$ gas was not introduced into the chamber 1. The flow rate of the Ar gas after adjustment was set to be constant.

The side surface 2321D of the projection portion 232D of the anode 23D was formed to have a rounded shape. The separation distance between the distal end 233D of the projection portion 232D of the anode 23D and the back surface of the shielding portion 241 of the metal member 24E in the Z1/Z2 direction was set to 2 mm. The electric resistance Ra of the resistor 13 was set to 105 kΩ. A direct current pulse power source among direct current power sources was employed as the power source 7 for supplying power to the target 21. The power was adjusted such that the specific power on the surface of the target 21 was constant at about 0.12 W/mm². The control apparatus 10 obtained the voltage from the power source 7 during plasma generation and adjusted the flow rate of the $O_2$ gas every obtaining interval such that the voltage of the power source 7 was kept at a target value.

Figure 14A:
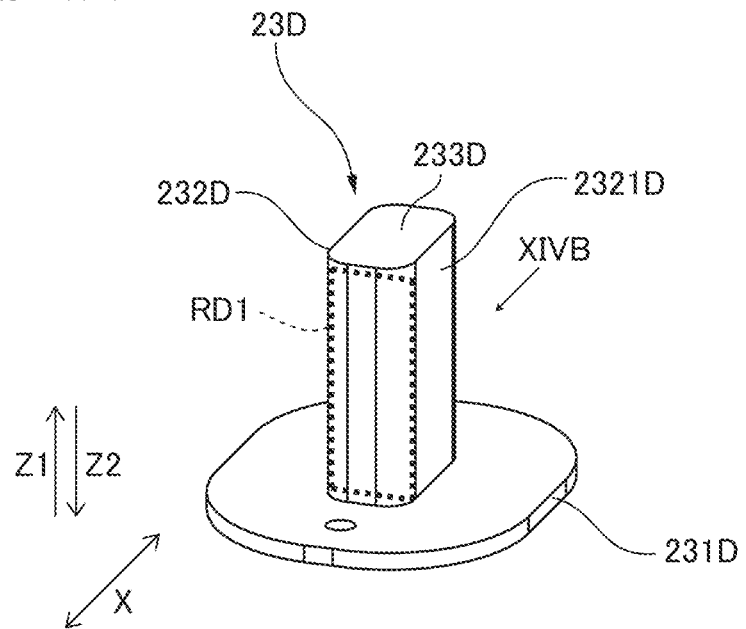
FIG. 14A is a schematic view of an anode of Example 3.
Figure 14B:
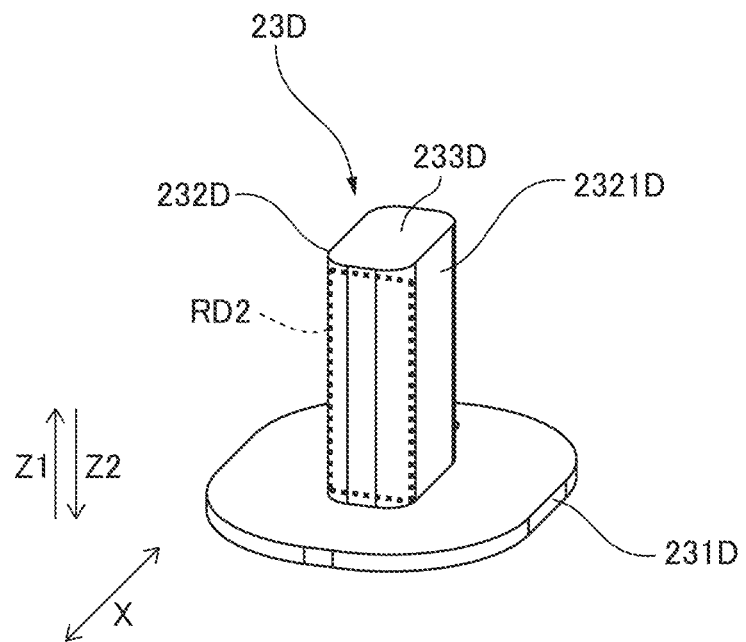
FIG. 14B is a schematic view of the anode of Example 3.

FIGS. 14A and 14B are each a schematic view of the anode 23D of Example 3. FIG. 14B illustrates the anode 23D of FIG. 14A as viewed in an arrow XIVB direction. The electric resistance of the side surface 2321D of the projection portion 232D of the anode 23D after 180 batches in the case where the plasma generation time per batch was about 6 minutes was measured. Specifically, in the side surface 2321D, the electric resistance of parts RD1 and RD2 respectively positioned under the two openings 242 in the Z2 direction and opposing each other in the X direction and the electric resistance of the other parts were measured. As a result of the measurement, the electric resistance of each of the parts RD1 and RD2 was in the range of 0Ω to 0.2Ω. In contrast, the electric resistance of the other parts than the parts RD1 and RD2 in the side surface 2321D was in the range of several Ω to several ten thousands of Ω, which was more than 10 times of that of the parts RD1 and RD2.

As described above, it can be considered that silicon and the oxygen gas that are relatively lightweight elements came around through the openings 242 to the parts having high electric resistance in the side surface 2321D and thus a $SiO_2$ thin film was formed thereon. In contrast, it can be considered that on the parts RD1 and RD2 having a low electric resistance in the side surface 2321D, the negative ions of the oxygen gas generated by the electrons and the oxygen gas that entered through the openings 242 were accelerated by the electric field, and the formed $SiO_2$ thin film was physically etched. From these results, it was confirmed that accumulation of the oxide thin film on the side surface of the anode 23D and elimination of the anode potential of the anode 23D can be reduced.

Figure 15:
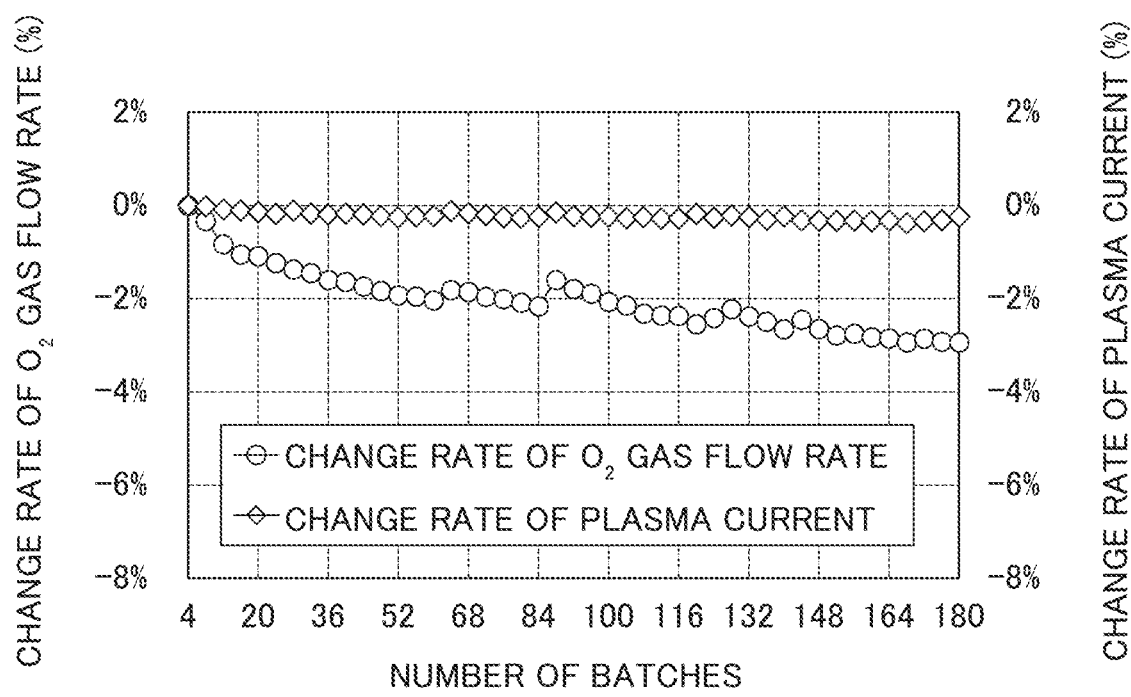
FIG. 15 is a graph illustrating experimental results of Example 3.

FIG. 15 is a graph illustrating experimental results of Example 3. FIG. 15 illustrates the change rate of the plasma current and the change rate of the $O_2$ gas flow rate with respect to the number of batches. When the $O_2$ gas flow rate of the first batch is represented by $F_1$ and the $O_2$ gas flow rate of the n-th batch is represented by $F_n$, the change rate of the $O_2$ gas flow rate is expressed by $(F_n-F_1)/F_1$. The power during plasma generation was set to be constant, and the voltage at this time was controlled by using the flow rate of the $O_2$ gas. Therefore, it can be seen that the current of the plasma was constant and the flow rate of the 02 gas of each batch also showed a tendency to settle down. As described above, the flow rate of the $O_2$ gas can be also stabilized to be approximately constant. Since the flow rate of the Ar gas for sputtering is set to be constant, the percentage of oxidation on the surface of the target 21 is also approximately constant, and thus the amount of the target 21 subjected to sputtering can be also made approximately constant. As a result of this, in film formation of sputtering in which the distance between the target 21 and the substrate 3 is small, the flux ratio between the 02 gas and the particles of the sputtered target 21 on the surface of the substrate 3 can be stabilized. That is, the stoichiometric composition of the oxide thin film formed on the substrate 3 is stabilized. When the stoichiometric composition of the oxide thin film is stabilized, the electric resistance, the refractive index, and the like, which are important values for the thin film, are stabilized.

According to the examination described above, it was confirmed that elimination of the anode potential can be suppressed, and a result showing that not only the plasma but also the flow rate of the $O_2$ gas can be stabilized by suppressing the elimination of the anode potential was obtained. Therefore, it was confirmed that the plasma can be stably generated for a long period.

The present invention is not limited to the embodiments described above, and can be modified in many ways within the technical concept of the present invention. In addition, the effects described in the embodiments are merely enumeration of the most preferable effects that can be obtained from the present invention, and the effects of the present invention are not limited to those described in the embodiments.

Although a case where only one resistor 13 is provided has been described in the embodiments described above, the number is not limited to one, and a plurality of resistors 13 may be provided. In this case, the plurality of resistors may be connected in parallel or connected in series, or the connection may be a combination of parallel connection and serial connection.

In addition, although a case where the reactive gas is an oxygen ($O_2$) gas has been described in the embodiments described above, the configuration is not limited to this. The reactive gas may be selected in accordance with the thin film to be formed, and may be, for example, a nitrogen ($N_2$) gas.

According to the present disclosure, the plasma can be stably generated for a long period.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-119750, filed Jul. 20, 2021, and Japanese Patent Application No. 2022-102320, filed Jun. 27, 2022, which are hereby incorporated by reference herein in their entirety.

What is claimed is:

1. A sputtering apparatus comprising:
   a placement portion on which a target having a first opening is placed;
   an anode and a metal member electrically insulated from each other; and
   a magnet inside the placement portion configured to form a magnetic field along a surface of the target toward the first opening,
   wherein the target is disposed around the metal member,
   wherein the metal member is set to a ground potential or a floating potential,
   wherein the metal member has a second opening smaller than the first opening,
   wherein the placement portion has a recess portion that at least partially overlaps the first opening as viewed in a Z1/Z2 direction from a film formation object to the target,
   wherein the placement portion at least partially overlaps the target as viewed in the Z1/Z2 direction, and
   wherein the anode is disposed inside the recess portion in a direction X, in a direction Y, or in both a direction X and a direction Y, perpendicular to the Z1/Z2 direction and at least part of the metal member is disposed inside the first opening in the direction X, in the direction Y, or in both the direction X and the direction Y.

2. The sputtering apparatus according to claim 1, wherein the anode is set to a potential higher than a potential of the metal member.

3. The sputtering apparatus according to claim 1, wherein the anode is electrically connected to a positive electrode of a direct current power source, and
   the target is electrically connected to a negative electrode of the direct current power source.

4. The sputtering apparatus according to claim 1, wherein the metal member includes a shielding portion disposed at a position opposing the anode in a direction perpendicular to a surface of the target.

5. The sputtering apparatus according to claim 1, wherein the anode includes:
   a base portion supported by the placement portion; and
   a projection portion projecting in a direction perpendicular to a surface of the target with respect to the base portion.

6. The sputtering apparatus according to claim 5, wherein the metal member includes a side wall portion disposed to oppose a side surface of the projection portion.

7. A sputtering apparatus comprising a plurality of units each including:
   a placement portion on which a target having a first opening is placed;
   an anode and a metal member electrically insulated from each other; and
   a magnet inside the placement portion configured to form a magnetic field along a surface of the target toward the first opening,
   wherein the target is disposed around the metal member,
   wherein the metal member is set to a ground potential or a floating potential,
   wherein the metal member has a second opening smaller than the first opening,
   wherein the placement portion has a recess portion that at least partially overlaps the first opening as viewed in a Z1/Z2 direction from a film formation object to the target,
   wherein the placement portion at least partially overlaps the target as viewed in the Z1/Z2 direction,
   wherein the anode is disposed inside the recess portion in a direction X, in a direction Y, or in both a direction X and a direction Y, perpendicular to the Z1/Z2 direction and at least part of the metal member is disposed inside the first opening in the direction X, in the direction Y, or in both the direction X and the direction Y,
   wherein the anode includes a plurality of metal plates arranged at intervals, and the anode includes a support portion configured to support the plurality of metal plates, and
   wherein the plurality of units is arranged in a circumferential direction, and the plurality of units is integrally rotatable in the circumferential direction.

8. The sputtering apparatus according to claim 1, further comprising a supply portion having a supply port for supplying a gas including a reactive gas,
   wherein the supply port is positioned in the recess portion.

9. The sputtering apparatus according to claim 8, further comprising:
   a plasma emission monitor configured to detect emission intensity of light of a predetermined wavelength included in a generated plasma; and
   a control apparatus configured to adjust a flow rate of the gas on a basis of the detected emission intensity of the light of the predetermined wavelength.

10. The sputtering apparatus according to claim 1, further comprising a resistor electrically interconnecting the anode and a ground.

11. The sputtering apparatus according to claim 10, wherein an electric resistance of the resistor is 40 k$\Omega$ to 220 k$\Omega$.

12. A film formation method comprising forming a compound film on a film formation target by using the sputtering apparatus according to claim 1.

13. A method for manufacturing a product, the method comprising manufacturing the product by forming a compound film on a film formation target by using the sputtering apparatus according to claim 1.

14. A method for manufacturing a product by forming a compound film on a film formation target by using the sputtering apparatus according to claim 7, the method comprising:
   supplying oxygen as a reactive gas to a film formation chamber; and
   forming a film containing metal oxide as the compound film.

15. The sputtering apparatus according to claim 4, wherein the metal member has at least two second openings smaller than the first opening.

16. The sputtering apparatus according to claim 1, wherein at least a part of the metal member is disposed on a target side with respect to a position of the anode.

* * * * *